US012615902B2

(12) United States Patent
Shin et al.

(10) Patent No.: US 12,615,902 B2
(45) Date of Patent: Apr. 28, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 446 days.

(21) Appl. No.: 18/106,544

(22) Filed: Feb. 7, 2023

(65) Prior Publication Data

US 2024/0021658 A1     Jan. 18, 2024

(30) Foreign Application Priority Data

Jul. 14, 2022     (KR) ........................ 10-2022-0087182

(51) Int. Cl.
    *H10H 29/14*        (2025.01)
    *H10H 20/821*       (2025.01)
    *H10H 20/84*        (2025.01)
(52) U.S. Cl.
    CPC ........ *H10H 29/142* (2025.01); *H10H 20/821* (2025.01); *H10H 20/84* (2025.01)
(58) Field of Classification Search
    CPC . H10K 59/1213; H10K 59/123; H10K 59/124
    See application file for complete search history.

(56) References Cited

U.S. PATENT DOCUMENTS

| | | | | |
|---|---|---|---|---|
| 10,084,031 B2 * | 9/2018 | Park | ..................... | H10K 59/124 |
| 10,147,776 B2 | 12/2018 | Nam et al. | | |
| 10,249,603 B2 * | 4/2019 | Cho | ..................... | H01L 25/167 |
| 12,170,061 B2 * | 12/2024 | Shin | ..................... | H01L 25/0753 |
| 2016/0071891 A1 * | 3/2016 | Oh | ..................... | H10D 86/441 |
| | | | | 438/151 |
| 2017/0338438 A1 * | 11/2017 | Kwon | ..................... | H10K 59/122 |
| 2018/0019369 A1 * | 1/2018 | Cho | ..................... | H05K 1/181 |
| 2021/0249392 A1 * | 8/2021 | Woo | ..................... | H01L 25/167 |

FOREIGN PATENT DOCUMENTS

| | | |
|---|---|---|
| KR | 10-2018-0036818 | 4/2018 |
| KR | 10-1859484 | 5/2018 |
| KR | 10-2358423 | 2/2022 |
| WO | 2015/097597 | 7/2015 |

* cited by examiner

*Primary Examiner* — Evren Seven
(74) *Attorney, Agent, or Firm* — Womble Bond Dickinson (US) LLP

(57)     ABSTRACT

A display device includes a first conductive layer; a first insulating layer on the first conductive layer; a semiconductor layer disposed on the first insulating layer and electrically connected to the first conductive layer; a second conductive layer disposed on the semiconductor layer and electrically connected to the first conductive layer; and light emitting elements on the second conductive layer. A thickness of a part of the first insulating layer in a first area, which overlaps the semiconductor layer in a plan view, is different from a thickness of another part of the first insulating layer in a second area, which is exposed by the semiconductor layer.

18 Claims, 13 Drawing Sheets

LD: LD1, LD2, LD3, LD4

SPX1    SPX2    SPX3

CNE5    CNE1    ELT2(ELT3)

ELT2    ELT1    CNE1

LD1

C    C'

LD4

LD2

LD3

CNE4    CNE3    CNE2

Y
↑
│
Z └──→ X

ELT: ELT1, ELT2, ELT3
CNE: CNE1, CNE2, CNE3, CNE4, CNE5
LD: LD1, LD2, LD3, LD4
PXL: SPX1, SPX2, SPX3

DISPLAY DEVICE AND METHOD OF MANUFACTURING THE DISPLAY DEVICE

CROSS-REFERENCE TO RELATED APPLICATION

This application claims priority to and benefits of Korean patent application No. 10-2022-0087182 under 35 U.S.C. § 119, filed on Jul. 14, 2022 in the Korean Intellectual Property Office (KIPO), the entire contents of which are incorporated herein by reference.

BACKGROUND

1. Technical Field

The disclosure generally relates to a display device and a method of manufacturing the display device, which is capable of preventing deterioration of a transistor.

2. Description of the Related Art

The importance of display devices as communication media, has been emphasized because of the increasing developments of information technology.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device and a method of manufacturing the display device, which is capable of preventing deterioration of a transistor.

However, embodiments of the disclosure are not limited to those set forth herein. The above and other embodiments will become more apparent to one of ordinary skill in the art to which the disclosure pertains by referencing the detailed description of the disclosure given below.

In accordance with an aspect of the disclosure, there is provided a display device including a first conductive layer; a first insulating layer on the first conductive layer; a semiconductor layer disposed on the first insulating layer and electrically connected to the first conductive layer; a second conductive layer disposed on the semiconductor layer and electrically connected to the first conductive layer; and light emitting elements on the second conductive layer. A thickness of a part of the first insulating layer in a first area, which overlaps the semiconductor layer in a plan view, is different from a thickness of another part of the first insulating layer in a second area, which is exposed by the semiconductor layer.

The semiconductor layer may be in electrical contact with the first conductive layer through a first contact hole formed through the first insulating layer in the first area.

The second conductive layer may be in electrical contact with the first conductive layer through a second contact hole formed through the first insulating layer in the second area.

The thickness of the part of the first insulating layer in the first area may be thicker than the another part of the thickness of the first insulating layer in the second area.

The display device may further include a second insulating layer on the second semiconductor layer.

The second insulating layer may be disposed in the first area and expose the second area.

The second conductive layer may be disposed directly on the second insulating layer in the first area.

The second conductive layer may be disposed directly on the first insulating layer in the second area.

The display device may further include a first connection electrode disposed on first end portions of the light emitting elements, and a second connection electrode disposed on second end portions of the light emitting elements.

The first connection electrode and the second connection electrode may be disposed on a same layer.

In accordance with another aspect of the disclosure, there is provided a method of manufacturing a display device, the method including forming a first insulating layer on a first conductive layer; forming a semiconductor layer on a first area of the first insulating layer; etching a second area of the first insulating layer, which is exposed by the semiconductor layer; forming a second conductive layer on the second area of the first insulating layer; and providing light emitting elements on the second conductive layer.

The method may further include forming a first contact hole in the first area of the first insulating layer.

The forming of the first contact hole may further comprise partially etching the second area of the first insulating layer.

The semiconductor layer may be in electrical contact with the first conductive layer through the first contact hole.

The method may further include forming a second contact hole in the second area of the first insulating layer.

The second conductive layer may be in electrical contact with the first conductive layer through the second contact hole.

The method may further include forming a second insulating layer on the semiconductor layer.

The method may further include etching the semiconductor layer and the second insulating layer.

The method may further include forming a first connection electrode on first end portions of the light emitting elements; and forming a second connection electrode on second end portions of the light emitting elements.

The first connection electrode and the second connection electrode may be simultaneously formed through a same process.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 6 is a schematic cross-sectional view taken along line C-C' shown in FIG. 4;

FIG. 9 is a schematic perspective view illustrating a light emitting element in accordance with an embodiment of the disclosure;

DETAILED DESCRIPTION OF THE EMBODIMENTS

Figure 1:
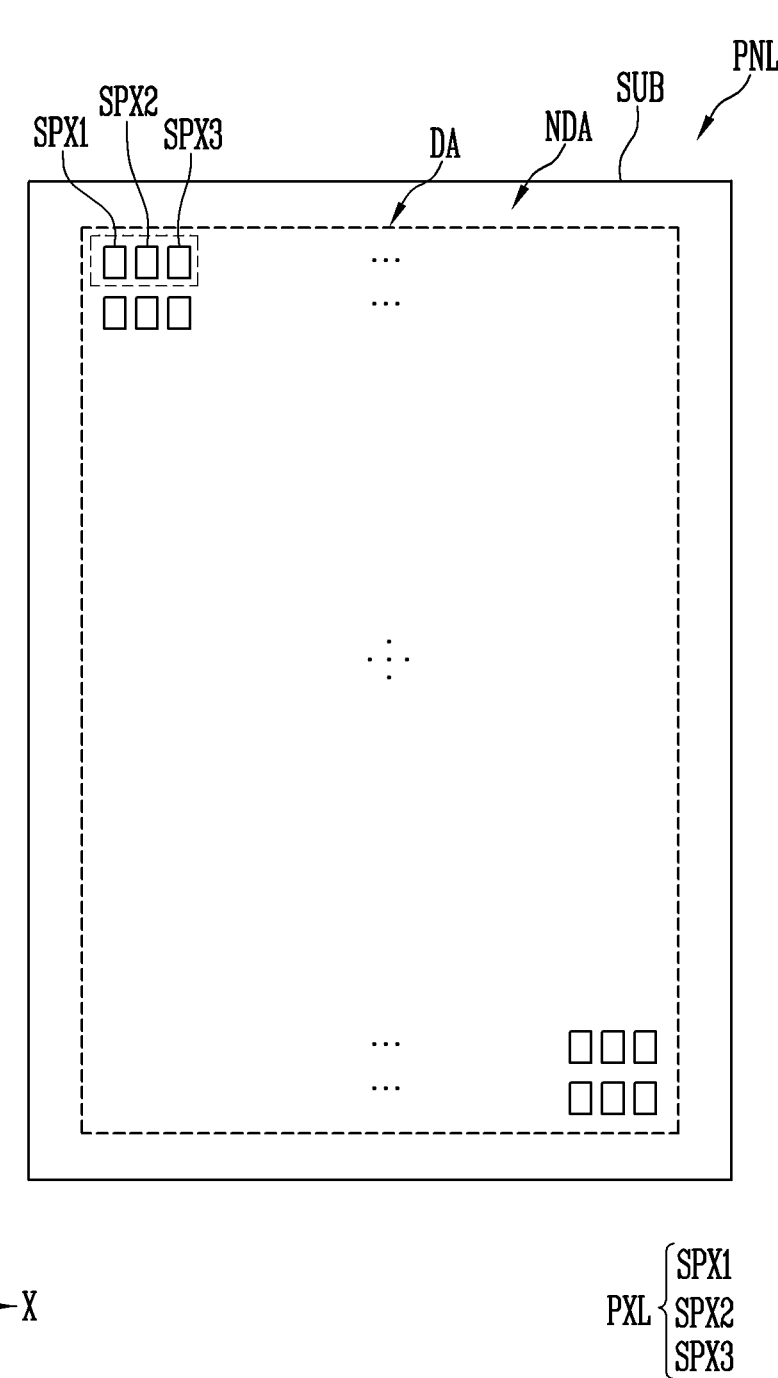
FIG. 1 is a schematic plan view illustrating a display device in accordance with an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure.

The terminology used herein is for the purpose of describing particular embodiments and is not intended to be limiting. As used herein, the singular forms are intended to include the plural forms as well, unless the context clearly indicates otherwise.

It will be further understood that the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, a display device in accordance with an embodiment of the disclosure is described with reference to the accompanying drawings.

FIG. 1 is a schematic plan view illustrating a display device in accordance with an embodiment of the disclosure. In FIG. 1, a display panel PNL provided in the display device is illustrated.

In FIG. 1, a structure of the display panel PNL is briefly illustrated based on a display area DA. However, in some embodiments, at least one driving circuit (e.g., at least one of a scan driver and a data driver), lines, and/or pads, which are not shown in the drawing, may be further disposed in the display panel PNL.

Referring to FIG. 1, the display panel PNL may include a substrate SUB and pixels PXL disposed on the substrate SUB.

The substrate SUB (or base layer) may be used to constitute a base member of the display panel PNL, and may be a rigid or flexible substrate (or film). In an example, the substrate SUB may be configured as a rigid substrate made of glass or tempered glass, a flexible substrate (or thin film) made of plastic or metal, or at least one insulating layer. The material and/or property of the substrate SUB is not limited thereto.

The substrate SUB may be substantially transparent. The term "substantially transparent" may mean that light may be transmitted with a transmittance (e.g., a predetermined or selectable transmittance) or more. In another embodiment, the substrate SUB may be translucent or opaque. Also, the substrate SUB may include a reflective material in some embodiments.

The display panel PNL and the substrate SUB for forming the display panel PNL may include the display area DA for displaying an image and a non-display area NDA except the display area DA.

The pixels PXL may be arranged in the display area DA. Various lines, pads, and/or a built-in circuit, which are electrically connected to the pixels PXL of the display area DA, may be disposed in the non-display area NDA.

Each of the pixels PXL may include sub-pixels SPX1, SPX2, and SPX3. For example, the pixel PXL may include a first sub-pixel SPX1, a second sub-pixel SPX2, and a third sub-pixel SPX3.

Each of the sub-pixels SPX1, SPX2, and SPX3 may emit light of a color (e.g., a predetermined or selectable color). In some embodiments, the sub-pixels SPX1, SPX2, and SPX3 may emit lights of different colors. In an example, the first sub-pixel SPX1 may emit light of a first color, the second sub-pixel SPX2 may emit light of a second color, and the third sub-pixel SPX3 may emit light of a third color. For example, the first sub-pixel SPX1 may be a red pixel emitting red light, the second sub-pixel SPX2 may be a green pixel emitting green light, and the third sub-pixel SPX3 may be a blue pixel emitting blue light. However, the disclosure is not limited thereto.

The first sub-pixel SPX1, the second sub-pixel SPX2, and the third sub-pixel SPX3 may have, as light sources, a light emitting element of the first color, a light emitting element of the second color, and a light emitting element of the third color, to emit lights of the first color, the second color, and the third color, respectively. In another embodiment, the first sub-pixel SPX1, the second sub-pixel SPX2, and the third sub-pixel SPX3 may have light emitting elements emitting light of a same color and include color conversion layers (or wavelength conversion layers) and/or color filters of different colors, which are disposed above the respective light emitting elements, to respectively emit lights of the first color, the second color, and the third color. However, the color, kind, and/or number of sub-pixels SPX1, SPX2, and SPX3 constituting each pixel PXL are not limited thereto. For example, the color of light emitted by each pixel PXL may be variously changed.

The sub-pixels SPX1, SPX2, and SPX3 may be regularly arranged according to a stripe structure, a PENTILE™ structure, or the like. For example, the first, second, and third sub-pixels SPX1, SPX2, and SPX3 may be sequentially and repeatedly disposed in a first direction (e.g., in an X-axis direction). Also, the first, second, and third sub-pixels SPX1, SPX2, and SPX3 may be repeatedly disposed in a second direction (e.g., in a Y-axis direction). At least one first sub-pixel SPX1, at least one second sub-pixel SPX2, and at least one third sub-pixel SPX3 may constitute each pixel PXL capable of emitting lights of various colors. However, the arrangement structure of the sub-pixels SPX1, SPX2, and SPX3 is not limited thereto, and the sub-pixels SPX1, SPX2, and SPX3 may be arranged in the display area DA in various structures and/or various manners.

Each of the sub-pixels SPX1, SPX2, and SPX3 may be configured as an active pixel. For example, each of the sub-pixels SPX1, SPX2, and SPX3 may include at least one light source (e.g., at least one light emitting element) driven by a control signal (e.g., a scan signal and a data signal) and/or a power source (e.g., a first power source and a second power source). However, the kind, structure, and/or driving method of the sub-pixels SPX1, SPX2, and SPX3, which may be applied to the display device, are not limited thereto.

Figure 2:
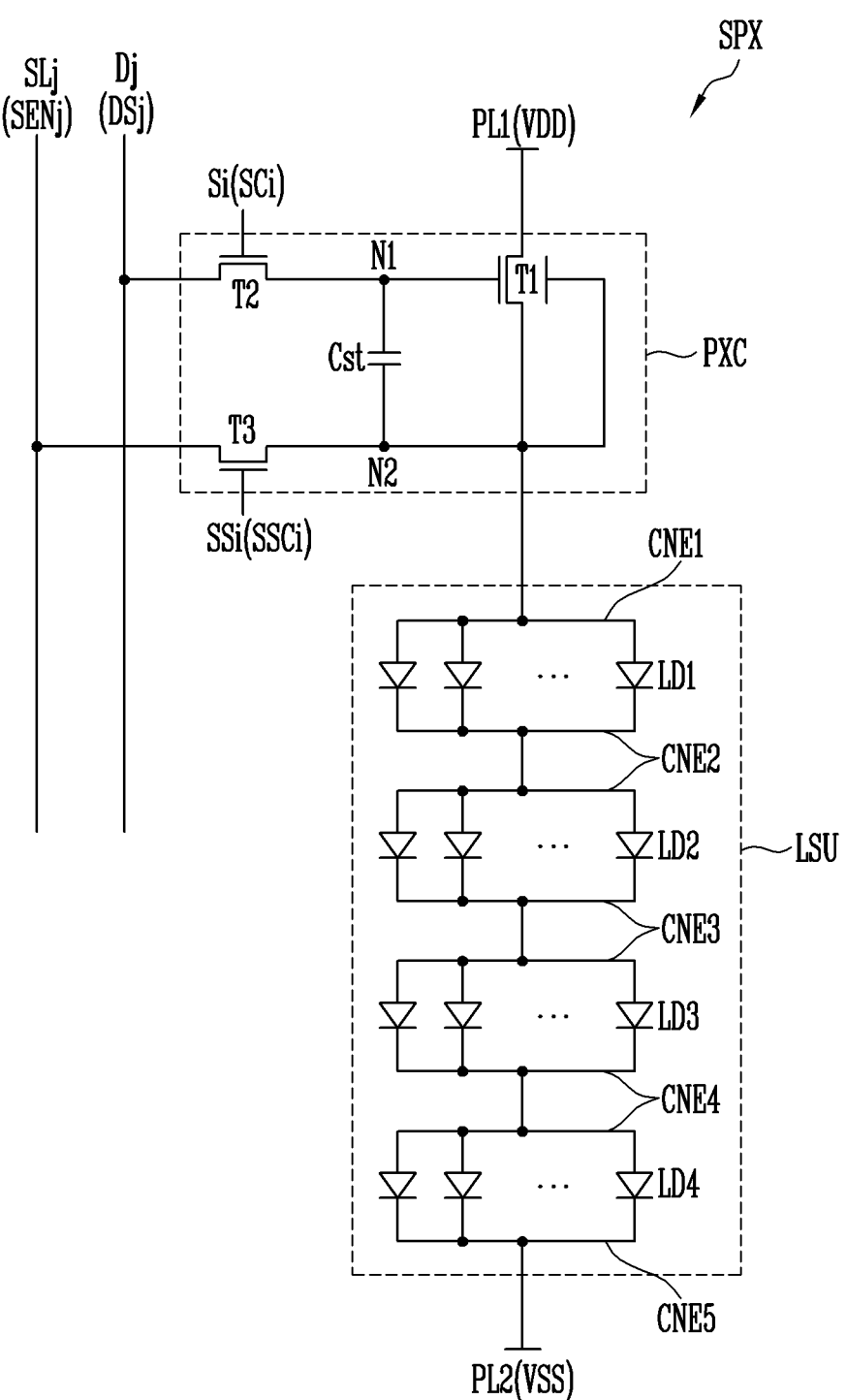
FIG. 2 is a schematic diagram of an equivalent circuit illustrating a sub-pixel in accordance with an embodiment of the disclosure.

FIG. 2 is a schematic diagram of an equivalent circuit illustrating a sub-pixel in accordance with an embodiment of the disclosure.

In some embodiments, a sub-pixel SPX shown in FIG. 2 may be any one of the first sub-pixel SPX1, the second sub-pixel SPX2, and the third sub-pixel SPX3, which are provided in the display panel PNL shown in FIG. 1. The first sub-pixel SPX1, the second sub-pixel SPX2, and the third sub-pixel SPX3 may have structures substantially identical or similar to one another.

Referring to FIG. 2, the sub-pixel SPX may include a light source part or light source unit LSU and a pixel circuit PXC. The light source part LSU may generate light with a luminance corresponding to a data signal. The pixel circuit PXC may drive the light source part LSU.

The light source part LSU may include at least one light emitting element LD electrically connected between a first power source VDD and a second power source VSS. The first power source VDD and the second power source VSS may have different potentials, and the light emitting element LD may emit light. In an example, the first power source VDD may be set as a high-potential power source, and the second power source VSS may be set as a low-potential power source. A potential difference between the first power source VDD and the second power source VSS may be set equal to or greater than a threshold voltage of the light emitting element LD during at least emission period of the sub-pixel SPX.

The light emitting element LD may emit light with a luminance corresponding to a driving current supplied through the pixel circuit PXC. The light emitting element LD may be configured as an inorganic light emitting diode such as a micro light emitting diode or a quantum dot light emitting diode. The light emitting element LD may be a light emitting diode having a subminiature size (e.g., a size small to a degree of nanometer scale to micrometer scale), which is manufactured by using a material having an inorganic crystalline structure. However, the disclosure is not limited thereto, and the light emitting element LD may be an organic light emitting diode.

The light source part LSU may include a first connection electrode CNE1, a fifth connection electrode CNE5, and multiple light emitting elements LD. The first connection electrode CNE1 may be electrically connected to the first power source VDD via the pixel circuit PXC and a first power line PL1. The fifth connection electrode CNE5 may be electrically connected to the second power source VSS through a second power line PL2. The multiple light emitting elements LD may be electrically connected to each other in a same direction between the first and fifth connection electrodes CNE1 and CNE5. The first connection electrode CNE1 (or first pixel electrode) may be or correspond to an anode electrode, and the fifth connection electrode CNE5 may be or correspond to a cathode electrode.

An end portion (e.g., a p-type end portion) of the light emitting element LD may be commonly connected (e.g., electrically connected) to the pixel circuit PXC through an electrode (e.g., the first connection electrode CNE1) of the light source part LSU, and be electrically connected to the first power source VDD through the pixel circuit PXC and the first power line PL1. Another end portion (e.g., an n-type end portion) of the light emitting element LD may be commonly connected (or electrically connected) to the second power source VSS through another electrode (e.g., the fifth connection electrode CNE5) and the second power line PL2.

The light source part LSU may include light emitting elements LD which constitute four serial stages (e.g., a first serial stage, a second serial stage, a third serial stage, and a fourth serial stage) and are electrically connected in series/parallel to each other. For example, the first serial stage of the four serial stages may include at least one first light emitting element LD1 electrically connected between the first connection electrode CNE1 and a second connection electrode CNE2. The second serial stage of the four serial stages may include at least one second light emitting element LD2 electrically connected between the second connection electrode CNE2 and a third connection electrode CNE3. The third serial stage of the four serial stages may include at least one third light emitting element LD3 electrically connected between the third connection electrode CNE3 and a fourth connection electrode CNE4. The fourth serial stage of the four serial stages may include at least one fourth light emitting element LD4 electrically connected between the fourth connection electrode CNE4 and the fifth connection electrode CNE5.

The light source part LSU may be configured by using light emitting elements LD having a same condition (e.g., same size and/or same number) as effective light sources, and the light emitting elements LD may be electrically connected in a series structure or a series/parallel hybrid structure. Thus, power efficiency of the light source part LSU may be improved. For example, in a light source part LSU in which light emitting elements LD are electrically connected in series or series/parallel, a high luminance may be expressed by using the same current, as compared with a light source part LSU in which light emitting elements LD are electrically connected only in parallel. Also, in the light source part LSU in which light emitting elements LD are electrically connected in series or series/parallel, the same luminance may be expressed by using a low driving current, as compared with the light source part LSU in which light emitting elements LD are electrically connected only in parallel. In addition, in a sub-pixel SPX in which light emitting elements LD are electrically connected in a series structure or a series/parallel hybrid structure, although a short-circuit defect or the like occurs in some series stages, a luminance to a degree (e.g., a certain or selectable degree) may be expressed through light emitting elements LD of other serial states. Thus, a possibility that a dark spot defect will occur in the sub-pixel SPX can be reduced.

The pixel circuit PXC may be electrically connected between the first power source VDD and the light source part LSU. The pixel circuit PXC may be electrically connected to a scan line Si (or gate line) and a data line Dj. Also, the pixel circuit PXC may be further electrically connected to a sensing control line SSi and a sensing line SLj. In an example, in case that the sub-pixel SPX is disposed on an ith (i is a natural number) horizontal line (e.g., row or pixel row) and a jth (j is a natural number) vertical line (e.g., column or pixel column) of the display area DA, the pixel circuit PXC of the sub-pixel SPX may be electrically connected to an ith scan line Si, an ith sensing control line SSi, a jth data line Dj, and a jth sensing line SLj.

In some embodiments, the pixel circuit PXC may include transistors and at least one capacitor. For example, the pixel circuit PXC may include a first transistor T1, a second transistor T2, a third transistor T3, and a storage capacitor Cst.

The first transistor T1 may be electrically connected between the first power source VDD and the light source part LSU. For example, a first electrode (e.g., a first terminal, a first transistor electrode, or a drain electrode) of the first transistor T1 may be electrically connected to the first power source VDD, and a second electrode (e.g., a second terminal, a second transistor electrode, or a source electrode) of the first transistor T1 may be electrically connected to an electrode (e.g., an anode electrode) of the light source part LSU. A gate electrode of the first transistor T1 may be electrically connected to a first node N1. A back-gate electrode of the first transistor T1 may be electrically connected to a second node N2. The first transistor T1 may control a driving current supplied to the light source part LSU, corresponding to a voltage of the first node N1. For example, the first transistor T1 may be a driving transistor for controlling a driving current of the sub-pixel SPX.

The second transistor T2 may be electrically connected between the data line Dj and the first node N1. For example, a first electrode of the second transistor T2 may be electrically connected to the data line Dj, and a second electrode of the second transistor T2 may be electrically connected to the first node N1. A gate electrode of the second transistor T2 may be electrically connected to the scan line Si. In case that a scan signal SCi having a gate-on voltage (e.g., a high level voltage) is supplied from the scan line Si, the data line Dj and the first node N1 may be electrically connected to each other, and the second transistor T2 may be turned on. A data signal DSj of a corresponding frame may be supplied to the data line Dj for each frame period. The data signal DSj may be transferred to the first node N1 through the second transistor T2 turned on during a period in which the scan signal SCi having the gate-on voltage is supplied. For example, the second transistor T2 may be a switching transistor for transferring each data signal DSj to the inside of the sub-pixel SPX.

The third transistor T3 may be electrically connected between the first transistor T1 and the sensing line SLj. For example, a first electrode of the third transistor T3 may be electrically connected to the sensing line SLj, and a second electrode of the third transistor T3 may be electrically connected to the second node N2 (or the second electrode of the first transistor T1). A gate electrode of the third transistor T3 may be electrically connected to the sensing controller SSi. In case that the sensing control line SSi is omitted, the gate electrode of the third transistor T3 may be electrically connected to the scan line Si (e.g., a previous scan line located on a row prior to a row on which the scan line Si is located, or a next scan line located on a row posterior to a row on which the scan line Si is located). The third transistor T3 may be turned on by a sensing control signal SSCi having a gate-on voltage supplied to the sensing control line SSi during a sensing period (e.g., a predetermined or selectable sensing period), to electrically connect the sensing line SLj and the first transistor T1 to each other. In some embodiments, a reference voltage (e.g., a predetermined reference voltage or an initialization voltage) may be applied to the sensing line SLj. The reference voltage may have a voltage level between the first power source VDD and the second power source VSS, but the disclosure is not limited thereto.

The storage capacitor Cst may be formed or electrically connected between the first node N1 and the second node N2. The storage capacitor Cst may charge a voltage corresponding to the data signal DSj supplied to the first node N1 during each frame period.

A first electrode of the storage capacitor Cst may be electrically connected to the second node N2, and a second electrode of the storage capacitor Cst may be electrically connected to the first node N1.

Although a case where the transistors, e.g., the first, second, and third transistors T1, T2, and T3, which are included in the pixel circuit PXC, are all N-type transistors is illustrated in FIG. 2, the disclosure is not limited thereto, and at least one of the first, second, and third transistors T1, T2, and T3 may be a P-type transistor. The pixel circuit PXC may be configured as a pixel circuit using various structures and/or various driving methods.

Figure 3:
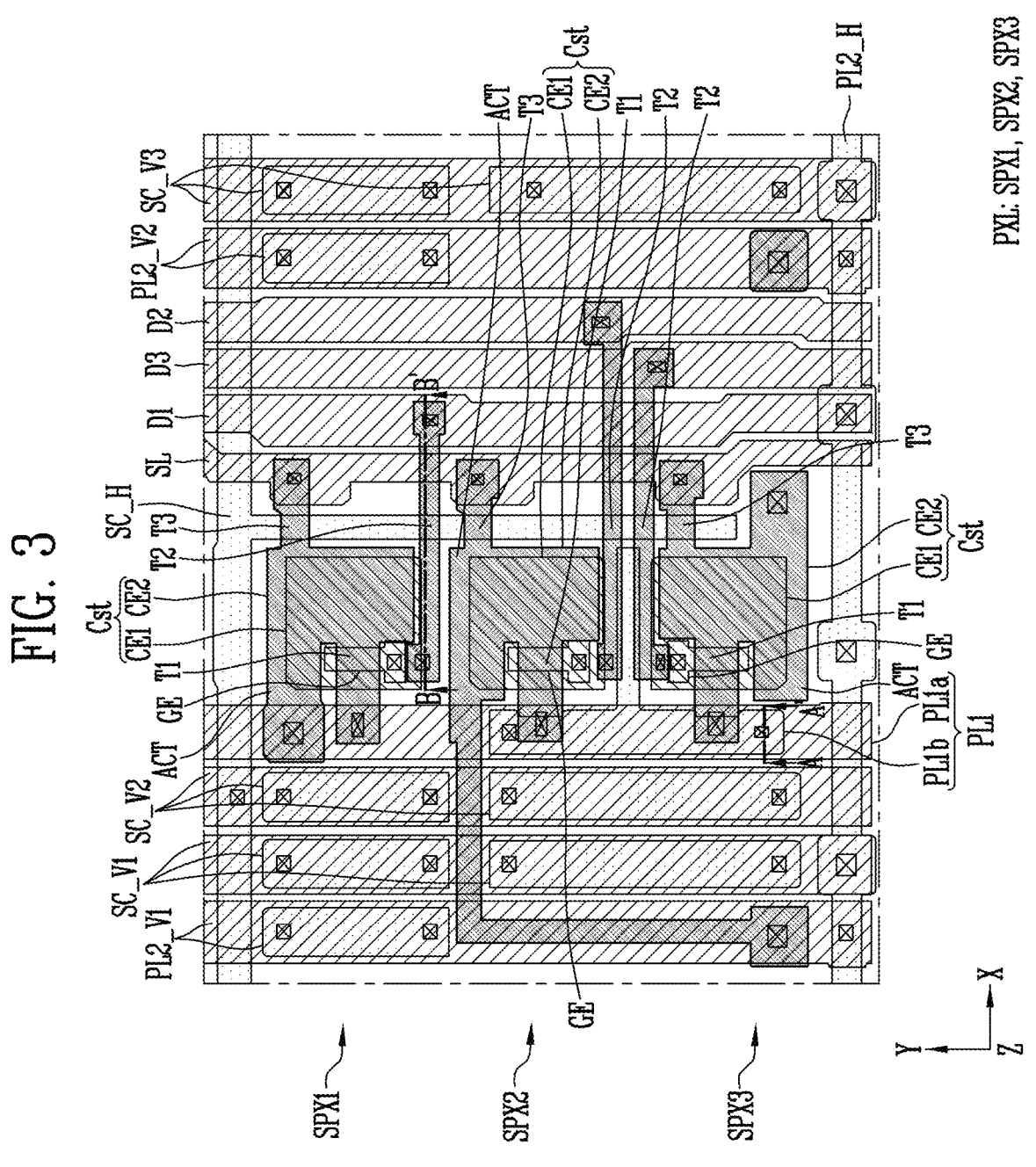
FIG. 3 is a schematic plan view illustrating a pixel in accordance with an embodiment of the disclosure.

FIG. 3 is a schematic plan view illustrating a pixel in accordance with an embodiment of the disclosure. In FIG. 3, a layout of sub-pixels SPX is illustrated based on the pixel circuit PXC (or pixel circuit layer) of the sub-pixel SPX shown in FIG. 2.

Referring to FIG. 3, the pixel PXL may include a first sub-pixel SPX1, a second sub-pixel SPX2, and a third sub-pixel SPX3. The first sub-pixel SPX1, the second sub-pixel SPX2, and the third sub-pixel SPX3 may have pixel structures (or circuit structures) substantially identical or similar to one another, and therefore, common components of the first sub-pixel SPX1, the second sub-pixel SPX2, and the third sub-pixel SPX3 are described based on the first sub-pixel SPX1.

A first power line PL1, vertical scan lines SC_V1, SC_V2, and SC_V3, a sensing line SL, data lines D1, D2, and D3, and vertical power lines PL2_V1 and PL2_V2 may extend roughly or generally in the second direction (e.g., in the Y-axis direction), and be arranged in the first direction (e.g., in the X-axis direction).

A first vertical power line PL2_V1, a first vertical scan line SC_V1, a second vertical scan line SC_V2, and/or the first power line PL1 may be disposed at a left side of a storage capacitor Cst of the sub-pixel SPX. The sensing line SL, the data lines D1, D2, and D3, a second vertical power line PL2_V2, and/or a third vertical scan line SC_V3 may be disposed at a right side of the storage capacitor Cst of the sub-pixel SPX. However, the disclosure is not limited thereto.

The first power line PL1 may be formed with conductive layers. In an example, the first power line PL1 may include a first power conductive layer PL1a and a second power conductive layer PL1b. The first power conductive layer PL1a may be formed as a first conductive layer, and the second power conductive layer PL1b may be formed as a second conductive layer. The second power conductive layer PL1b may be electrically connected to the first power conductive layer PL1a through a contact hole penetrating an insulating layer (e.g., an interlayer insulating layer ILD of FIG. 5).

Each of the first vertical power line PL2_V1, the first vertical scan line SC_V1, the second vertical scan line SC_V2, the second vertical power line PL2_V2, and/or the third vertical scan line SC_V3 may be formed with conductive layers. In an example, each of the first vertical power line PL2_V1, the first vertical scan line SC_V1, the second vertical scan line SC_V2, the second vertical power line PL2_V2, and/or the third vertical scan line SC_V3 may be formed with a first conductive layer and a second conductive layer, but the disclosure is not limited thereto.

A horizontal power line PL2_H and a horizontal scan line SC_H may extend in the first direction (e.g., in the X-axis direction), and be arranged in the second direction (e.g., in the Y-axis direction). In an example, the horizontal scan line SC_H may extend in the first direction (e.g., in the X-axis direction), and may partially extend in the second direction (e.g., in the Y-axis direction).

The horizontal scan line SC_H may be disposed at a top side of the storage capacitor Cst of the sub-pixel SPX, and the horizontal power line PL2_H may be disposed at a bottom side of the storage capacitor Cst of the sub-pixel SPX. However, the disclosure is not limited thereto.

The horizontal power line PL2_H and the horizontal scan line SC_H may be disposed on a same layer. In an example, the horizontal power line PL2_H and the horizontal scan line SC_H may include a same material, and be formed in or on a same layer through a same process. The horizontal power line PL2_H and the horizontal scan line SC_H may be formed with a second conductive layer, but the disclosure is not limited thereto.

The horizontal power line PL2_H may intersect the first vertical power line PL2_V1 and the second vertical power line PL2_V2. The horizontal power line PL2_H may be electrically connected respectively to the first vertical power line PL2_V1 and the second vertical power line PL2_V2 through contact holes (e.g., contact holes penetrating the interlayer insulating layer ILD of FIG. 5) in areas in which the horizontal power line PL2_H may intersect the first vertical power line PL2_V1 and the second vertical power line PL2_V2. For example, the horizontal power line PL2_H, the first vertical power line PL2_V1, and the second vertical power line PL2_V2 may form (e.g., entirely form) a mesh structure.

A first capacitor electrode CE1 and a second capacitor electrode CE2 may overlap each other in a plan view, and constitute the storage capacitor Cst. The first capacitor electrode CE1 may be covered (e.g., roughly or substantially covered) by the second capacitor electrode CE2. An area of the first capacitor electrode CE1 may be smaller than an area of the second capacitor electrode CE2. Most area of the first capacitor electrode CE1 may overlap the second capacitor electrode CE2 in a plan view, and a capacitance (or capacity) of the storage capacitor Cst may be increased or maximized.

An area of a semiconductor layer ACT may partially overlap a gate electrode GE in a plan view. The area of the semiconductor layer ACT, which overlaps the gate electrode GE in a plan view, may constitute a channel of a first transistor T1. Areas of the semiconductor layer ACT may partially overlap the horizontal scan line SC_H in a plan view. The areas of the semiconductor layer ACT, which overlap the horizontal scan line SC_H in a plan view, may respectively constitute channels of a second transistor T2 and a third transistor T3. An area of the semiconductor layer ACT may be electrically connected to the first power line PL1 through a contact hole (e.g., a contact hole penetrating the interlayer insulating layer ILD of FIG. 5). An area of the semiconductor layer ACT may be electrically connected to at least one of the data lines D1, D2, and D3 through a contact hole (e.g., a contact hole penetrating the interlayer insulating layer ILD of FIG. 5). An area of the semiconductor layer ACT may be electrically connected to the sensing line SL through a contact hole (e.g., a contact hole penetrating the interlayer insulating layer ILD of FIG. 5).

The semiconductor layer ACT may include poly-silicon, amorphous silicon, an oxide semiconductor, and the like. A channel of the semiconductor layer ACT may be a semiconductor pattern undoped with an impurity, and a portion of the semiconductor layer ACT except the channel may be a semiconductor pattern doped with the impurity.

Figure 4:
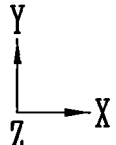
FIG. 4 is a schematic plan view illustrating a pixel in accordance with an embodiment of the disclosure.

FIG. 4 is a schematic plan view illustrating a pixel in accordance with an embodiment of the disclosure. In FIG. 4, a pixel PXL is briefly illustrated based on the light source part LSU of the sub-pixel SPX shown in FIG. 2. A first sub-pixel SPX1, a second sub-pixel SPX2, and a third sub-pixel SPX3 of the pixel PXL are substantially identical or similar to one another. Therefore, the first sub-pixel SPX1 will be mainly described, and repetitive descriptions will not be provided.

A first electrode ELT1 and a second electrode ELT2 may extend in the second direction (e.g., in the Y-axis direction) and be arranged in the first direction (e.g., in the X-axis direction). For convenience of description, the second electrode ELT2 located in a right direction of the first sub-pixel SPX1 (or corresponding sub-pixel) may be referred to as a third electrode ELT3 (e.g., third electrode or third reflective electrode).

The second electrode ELT2 may extend even to sub-pixels SPX (e.g., adjacent sub-pixels SPX) adjacent to the first sub-pixel SPX1 in the second direction (e.g., in the Y-axis direction). For example, the second electrode ELT2 may extend throughout multiple sub-pixels SPX, but the disclosure is not limited thereto.

The electrodes ELT may be used as electrodes for alignment of a light emitting element LD. In a process of manufacturing the display device, the light emitting element LD supplied to an emission area may be aligned in a direction (e.g., a desired or selectable direction) and/or at a position (e.g., a desired or selectable position) by an electric field formed between the electrodes ELT (e.g., between adjacent ones of the first to third electrodes ELT1 to ELT3). For example, the light emitting element LD may be aligned between the first electrode ELT1 and the second electrode ELT2 (or the third electrode ELT3), and a length direction of the light emitting element LD may be substantially in parallel to the first direction (e.g., in the X-axis direction).

A first connection electrode CNE1 may overlap a first end portion of a first light emitting element LD1 and the first electrode ELT1 in a plan view. The first connection electrode CNE1 may electrically connect the first end portion of the first light emitting element LD1 to the first electrode ELT1.

A second connection electrode CNE2 may overlap a second end portion of the first light emitting element LD1 and the second electrode ELT2 (or the third electrode ELT3) in a plan view. Also, the second connection electrode CNE2 may overlap a first end portion of a second light emitting element LD2 and the first electrode ELT1 in a plan view. Thus, a portion of the second connection electrode CNE2 may have a bent shape. The second connection electrode CNE2 may electrically connect the second end portion of the first light emitting element LD1 to the first end portion of the second light emitting element LD2.

A third connection electrode CNE3 may overlap a second end portion of the second light emitting element LD2 and the second electrode ELT2 (or the third electrode ELT3) in a plan view. Also, the third connection electrode CNE3 may overlap a first end portion of a third light emitting element LD3 and the first electrode ELT1 in a plan view. The third connection electrode CNE3 may have a shape detouring (or bypassing) around the second connection electrode CNE2. The third connection electrode CNE3 may electrically connect the second end portion of the second light emitting element LD2 to the first end portion of the third light emitting element LD3.

A fourth connection electrode CNE4 may overlap a second end portion of the third light emitting element LD3 and the second electrode ELT2 in a plan view. Also, the fourth connection electrode CNE4 may be located to overlap a first end portion of a fourth light emitting element LD4 and the first electrode ELT1 in a plan view. To this end, a portion of the fourth connection electrode CNE4 may have a bent shape. The fourth connection electrode CNE4 may electrically connect the second end portion of the third light emitting element LD3 to the first end portion of the fourth light emitting element LD4.

A fifth connection electrode CNE5 may overlap a second end portion of the fourth light emitting element LD4 and the second electrode ELT2 in a plan view. The fifth connection electrode CNE5 may electrically connect the second end portion of the fourth light emitting element LD4 to the second electrode ELT2.

As described above, the light emitting elements LD may be electrically connected between the first connection electrode CNE1 and the fifth connection electrode CNE5. The shape of each of the electrodes ELT and the connection electrodes CNE may be variously modified according to an arrangement and/or a series/parallel structure of the light emitting elements LD.

Figure 5:
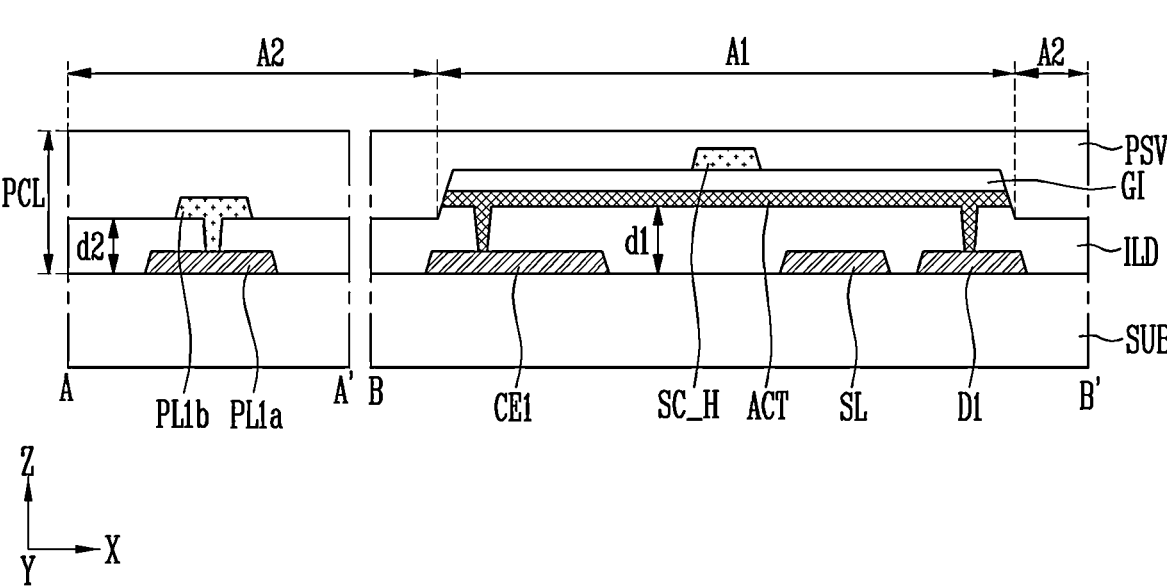
FIG. 5 is a schematic cross-sectional view taken along lines A-A' and B-B' shown in FIG. 3.
Figure 6:
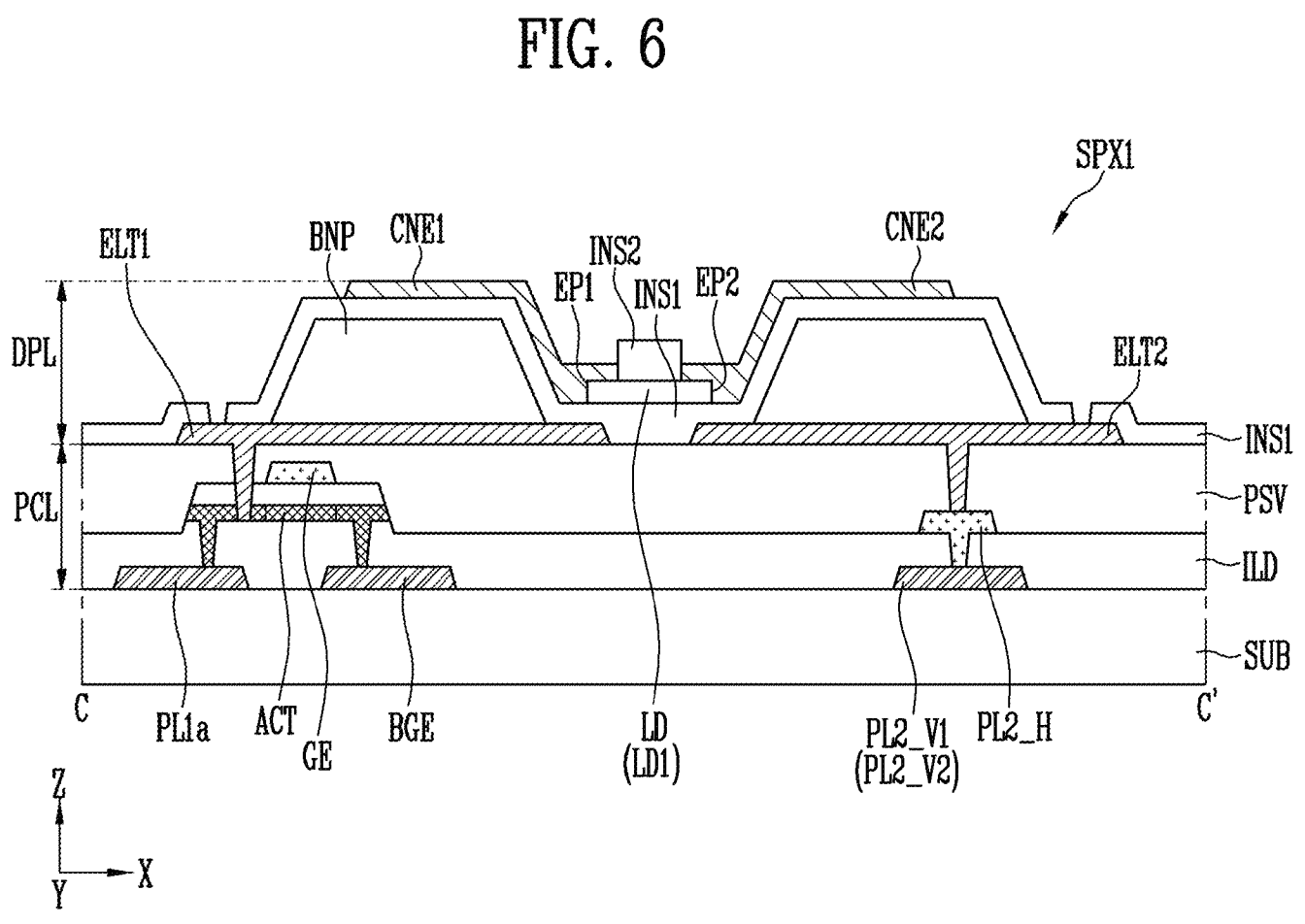

FIG. 5 is a schematic cross-sectional view taken along lines A-A' and B-B' shown in FIG. 3. FIG. 6 is a schematic cross-sectional view taken along line C-C' shown in FIG. 4.

In FIG. 5, a sub-pixel SPX is simplified and illustrated. For example, each electrode is illustrated only as a single-film electrode and each insulating layer is illustrated only as a single-film insulating layer. However, the disclosure is not limited thereto. In FIG. 6, a first sub-pixel SPX1 (or sub-pixel) is simplified and illustrated based on a light emitting element LD.

The first sub-pixel SPX1 may include a pixel circuit layer PCL and a display element layer DPL, which are disposed on a substrate SUB.

The pixel circuit layer PCL may include a first conductive layer (or first metal layer), an interlayer insulating layer ILD, a semiconductor layer ACT, a gate insulating layer GI, a second conductive layer (or second metal layer), and/or a protective layer PSV.

The first conductive layer may be disposed on the substrate SUB. The first conductive layer may include a first power conductive layer PL1*a*, a first capacitor electrode CE1, a sensing line SL, data lines D1, D2, and D3, a back gate electrode BGE, and/or vertical power lines PL2_V1 and PL2_V2. The back gate electrode BGE may be an area of the first capacitor electrode CE1 overlapping the semiconductor layer ACT in a plan view.

The first conductive layer may include a conductive material. For example, the conductive material of the first conductive layer may include at least one of copper (Cu), molybdenum (Mo), tungsten (W), aluminum neodymium (AlNd), titanium (Ti), aluminum (Al), and silver (Ag). In other embodiments, the first conductive layer may include any alloy thereof. The first conductive layer may be formed in a single-layer, double-layer, or multi-layer structure. The first conductive layer may be formed in a double-layer or multi-layer structure including at least one of molybdenum (Mo), titanium (Ti), copper (Cu), aluminum (Al), and silver (Ag), which are a low-resistance material, and wiring resistance of the first conductive layer may be decreased.

The interlayer insulating layer ILD may be disposed over the first conductive layer. The interlayer insulating layer ILD may be an inorganic insulating layer including an inorganic material. For example, the inorganic material of the inorganic insulating layer may include at least one metal oxide of silicon nitride (SiN$_x$), silicon oxide (SiO$_x$), silicon oxynitride (SiO$_x$N$_y$), and aluminum oxide (AlO$_x$). The interlayer insulating layer ILD may be provided as a single layer, but be provided as a multi-layer including at least two layers. In case that the interlayer insulating layer ILD is provided as the multi-layer, the layers of the interlayer insulating layer ILD may be formed of a same material or be formed of different materials.

The interlayer insulating layer ILD may have different thicknesses according to areas. For example, a thickness d1 of the interlayer insulating layer ILD (e.g., a part of the interlayer insulating layer ILD) in a first area A1 overlapping the semiconductor layer ACT in a plan view may be different from a thickness d2 of the interlayer insulating layer ILD (e.g., another part of the interlayer insulating layer ILD) in a second area A2 exposed by the semiconductor layer ACT.

In an example, the thickness d1 of the interlayer insulating layer ILD (e.g., the part of the interlayer insulating layer ILD) in the first area A1 may be thicker than the thickness d2 of the interlayer insulating layer ILD (e.g., the another part of the interlayer insulating layer ILD) in the second area A2. The second conductive layer and the semiconductor layer ACT may be formed in different thicknesses according to areas of the interlayer insulating layer ILD in a process of etching the interlayer insulating layer ILD to form a contact hole (or contact part) through which each of the second conductive layer and the semiconductor layer ACT is electrically connected to the first conductive layer. The above-elements are described below in detail with reference to FIGS. 11 to 17.

The semiconductor layer ACT may be disposed on the interlayer insulating layer ILD. In an example, the semiconductor layer ACT may be disposed on the first area A1 of the interlayer insulating layer ILD. The semiconductor layer ACT may be electrically connected to the first conductive layer through contact holes formed in the first area A1. In an example, an area of the semiconductor layer ACT may be electrically connected to the first capacitor electrode CE1 through a contact hole penetrating the interlayer insulating layer ILD. An area of the semiconductor layer ACT may be electrically connected to a first data line D1 through a contact hole penetrating the interlayer insulating layer ILD. A channel of the semiconductor layer ACT may overlap a gate electrode GE in a plan view. The channel of the semiconductor layer ACT may be located between a first contact region and a second contact region. The first contact region of the semiconductor layer ACT may be electrically connected to the first power conductive layer PL1*a* through a contact hole penetrating the interlayer insulating layer ILD. The second contact region of the semiconductor layer ACT may be electrically connected to the back gate electrode BGE through a contact hole penetrating the interlayer insulating layer ILD.

The semiconductor layer ACT may be a semiconductor pattern made of amorphous silicon, poly-silicon, low temperature poly-silicon, an oxide semiconductor, an organic semiconductor, or the like. In an example, the channel of the semiconductor layer ACT may be a semiconductor pattern undoped with an impurity, and may be an intrinsic semiconductor. Each of the first contact region and the second contact region of the semiconductor layer ACT may be a semiconductor pattern doped with the impurity.

The gate insulating layer GI may be disposed on the semiconductor layer ACT.

The gate insulating layer GI may include an inorganic material. Various materials which give an insulating property to the gate insulating layer GI may be applied. In an example, the gate insulating layer GI may include an organic material. The gate insulating layer GI may be provided as a single layer, but be provided as a multi-layer including at least two layers. The gate insulating layer GI may overlap (e.g., completely overlap) the semiconductor layer ACT in a plan view. In an example, the gate insulating layer GI may be located in the first area A1 and expose the second area A2.

The second conductive layer may be disposed on the interlayer insulating layer ILD and/or the gate insulating layer GI. The second conductive layer may be disposed (e.g., directly disposed) on the gate insulating layer GI in the first area A1. The second conductive layer may be disposed (e.g., directly disposed) on the interlayer insulating layer ILD (e.g., another part of the interlayer insulating layer ILD) in the second area A2.

The second conductive layer may include a second power conductive layer PL1b, a horizontal scan line SC_H, the gate electrode GE, and/or a horizontal power line PL2_H. The second conductive layer may be electrically connected to the first conductive layer through contact holes (e.g., contact holes penetrating the interlayer insulating layer ILD) formed in the second area A2. In an example, the second power conductive layer PL1b may be electrically connected to the first power conductive layer PL1a through a contact hole penetrating the interlayer insulating layer ILD. The horizontal power line PL2_H may be electrically connected to the vertical power lines PL2_V1 and PL2_V2 through contact holes penetrating the interlayer insulating layer ILD.

The second conductive layer may include a conductive material. The second conductive layer and the first conductive layer may include a same material. The second conductive layer may include at least one material selected from the materials that may be used to form the first conductive layer as discussed herein.

The protective layer PSV may be disposed over the second conductive layer. The protective layer PSV may include an organic material and/or an inorganic material. For example, the organic material of the protective layer PSV may include at least one of acrylic resin, epoxy resin, phenolic resin, polyamide resin, polyimide resin, unsaturated polyester resin, poly-phenylene ether resin, poly-phenylene sulfide resin, and benzocyclobutene resin. For example, the protective layer PSV may be provided in a form including an organic layer, an inorganic layer, or an organic layer disposed on an inorganic layer.

The display element layer DPL may be provided on the protective layer PSV of the pixel circuit layer PCL.

The display element layer DPL may include electrodes ELT (e.g., a first electrode ELT1 and a second electrode ELT2), bank patterns BNP, a first insulating layer INS1, a light emitting element LD, a second insulating layer INS2, and/or connection electrodes CNE (e.g., a first connection electrode CNE1 and a second connection electrode CNE2).

The electrodes ELT may be disposed on the protective layer PSV. The electrodes ELT (e.g., the first and second connection electrodes CNE1 and CNE2) may be spaced apart from each other. The first electrode ELT1 may be electrically connected to an area of the semiconductor layer ACT through a contact hole penetrating the protective layer PSV. The second electrode ELT2 may be electrically connected to the horizontal power line PL2_H through a contact hole penetrating the protective layer PSV.

In the process of manufacturing the display device, the first electrode ELT1 and the second electrode ELT2 may be used as alignment lines for receiving an alignment signal (or alignment voltage) to align light emitting elements LD. In an example, the first electrode ELT1 may receive a first alignment signal (or first alignment voltage) transferred from a component (e.g., the first power line PL1) of the pixel circuit layer PCL and be used as a first alignment line. The second electrode ELT2 may receive a second alignment signal (or second alignment voltage) transferred from another component (e.g., the horizontal power line PL2_H) of the pixel circuit layer PCL and be used as a second alignment line.

The electrodes ELT may be configured with a material having a constant reflexibility to allow light emitted from the light emitting element LD to advance in an image display direction (e.g., the Z-axis direction) of the display device. The electrodes ELT may be configured with a conductive material having a constant reflexibility. The conductive material of the electrodes ELT may include an opaque metal advantageous in reflecting light emitted from the light emitting element LD in the image display direction of the display device. The opaque metal of the electrodes ELT may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, the electrodes ELT may include a transparent conductive material. The transparent conductive material of the electrodes ELT may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene) (PEDOT), and the like. When the electrodes ELT includes a transparent conductive material, a separate conductive layer (or an additional conductive layer) may be added, which is made of an opaque metal for reflecting light emitted from the light emitting element LD in the image display direction of the display device. However, the material of the electrodes ELT is not limited to the above-described materials.

Each of the electrodes ELT may be provided and/or formed as a single layer, but the disclosure is not limited thereto. In some embodiments, each of the electrodes ELT may be provided and/or formed as a multi-layer in which at least two materials among metals, alloys, conductive oxide, and conductive polymers are stacked one another. Each of the electrodes ELT may be formed as a multi-layer including at least two layers so as to minimize distortion caused by a signal delay when a signal (or voltage) is transferred to the light emitting element LD. In an example, each of the electrodes ELT may be formed as a multi-layer in which indium tin oxide (ITO)/silver (Ag)/indium tin oxide (ITO) are sequentially stacked.

The bank patterns BNP may be respectively provided and/or formed on the electrodes ELT. Each of the bank patterns BNP may be a dam structure which prevents a solution including the light emitting element LD from being introduced into an adjacent sub-pixel or controls an amount (e.g., a certain or selectable amount) of solution to be supplied to each sub-pixel SPX in a process of supplying the light emitting element LD. For example, each of the bank patterns BNP may separate the sub-pixel SPX (e.g., corresponding sub-pixel SPX) from the adjacent sub-pixel, and the solution including the light emitting element LD may be supplied to the corresponding sub-pixel SPX.

The bank patterns BNP may include an inorganic material or an organic material. In some embodiments, the bank patterns BNP may include a single organic layer and/or a single inorganic layer, but the disclosure is not limited thereto. In some embodiments, the bank patterns BNP may be provided in the form of a multi-layer in which at least one organic layer and at least one inorganic layer are stacked each other. However, the material of the bank patterns BNP is not limited to the above-described embodiments. In some embodiments, the bank patterns BNP may include a conductive material.

The bank patterns BNP may have a cross-section of a trapezoid of which width is narrowed as approaching the top thereof in a third direction (e.g., in a Z-axis direction), but the disclosure is not limited thereto. In some embodiments, the bank patterns BNP may include a curved surface having a cross-section of a semi-ellipse, a semicircle (or hemisphere), or the like, of which width is narrowed as approaching the top thereof. However, the disclosure is not limited thereto.

Although a case where the bank patterns BNP are disposed on the electrodes ELT has been described in the above-described embodiment, the disclosure is not limited thereto. In some embodiments, the bank patterns BNP may be disposed between the electrodes ELT and the protective layer PSV. In some embodiments, the bank patterns BNP and the protective layer PSV may be formed through a same process. In some embodiments, the bank patterns BNP may be omitted.

The first insulating layer INS1 may be provided and/or formed over the bank patterns BNP. The first insulating layer INS1 may include an inorganic material, but the disclosure is not limited thereto.

The light emitting element LD may be disposed between the electrodes ELT on the first insulating layer INS1. The light emitting element LD may be a light emitting diode having a subminiature size (e.g., a size small to a degree of nanometer scale to micrometer scale), which is manufactured by using a material having an inorganic crystalline structure. For example, the light emitting element LD may include a first semiconductor layer, a second semiconductor layer, an active layer, and an insulative film. The first semiconductor layer of the light emitting element LD may include a semiconductor layer having a type (e.g., a predetermined or selectable type), and the second semiconductor layer of the light emitting element LD may include a semiconductor layer having a type different from the type of the first semiconductor layer. In an example, the first semiconductor layer may include a p-type semiconductor layer, and the second semiconductor layer may include an n-type semiconductor layer. The first semiconductor layer and the second semiconductor layer may include at least one semiconductor material of InAlGaN, GaN, AlGaN, InGaN, AlN, and InN. The active layer of the light emitting element LD may be located between the first semiconductor layer and the second semiconductor layer, and have a single or multiple quantum well structure. In case that an electric field having a voltage (e.g., a predetermined or selectable voltage) or higher is applied to ends (e.g., both ends) of the light emitting element LD, electron-hole pairs may be combined in the active layer, and the light emitting element LD may emit light.

The second insulating layer INS2 may be disposed on light emitting elements LD. For example, the second insulating layer INS2 may be partially provided on the light emitting elements LD, and expose first and second end portions EP1 and EP2 of the light emitting elements LD. In case that the second insulating layer INS2 on the light emitting elements LD after the light emitting elements LD are completely aligned, the light emitting elements LD can be prevented from being separated from positions at which the light emitting elements LD are aligned.

The connection electrodes CNE may be disposed on the first and second end portions EP1 and EP2 of the light emitting elements LD, which are exposed by the second insulating layer INS2. A first connection electrode CNE1 may be disposed (e.g., directly disposed) on first end portions EP1 of first light emitting elements LD1, and be in contact with the first end portions EP1 of first light emitting elements LD1. A second connection electrode CNE2 may be disposed (e.g., directly disposed) on second end portions EP2 of the first light emitting element LD1, and be in contact with the second end portions EP2 of the first light emitting element LD1.

The connection electrodes CNE may be configured as a same conductive layer. The connection electrode CNE may be simultaneously formed through a same process. As described above, when the connection electrodes CNE are simultaneously formed, the number of masks may be decreased, and the process of manufacturing the display device may be simplified. In some embodiments, the connection electrodes CNE may be formed of multiple conductive layers.

The connection electrode CNE may be configured with various transparent conductive materials, but the disclosure is not limited thereto. In some embodiments, the connection electrode CNE may be configured with various opaque conductive materials (or substances). The connection electrodes CNE may be formed with a single layer or a multilayer.

In some embodiments, the display element layer DPL may be configured to selectively further include an optical layer. In an example, the display element layer DPL may further include a color conversion layer including color conversion particles for converting light emitted from the light emitting elements LD into light of a color (e.g., a specific or selectable color). Also, the display element layer DPL may further include a color filter for allowing only light in a wavelength band (e.g., a specific or selectable wavelength band) to be transmitted therethrough.

In accordance with the above-described embodiment, the semiconductor layer ACT and the second conductive layer may be electrically connected to the first conductive layer respectively through contact holes formed in different areas. Accordingly, a side surface contact structure of the second conductive layer and the semiconductor layer ACT may be removed. For example, the second conductive layer and the semiconductor layer ACT may not be in contact with other elements through a side surface thereof. Thus, transistor characteristic deterioration occurring due to the side surface contact may be prevented, and electrical characteristics of the transistor may be improved.

Figure 7:
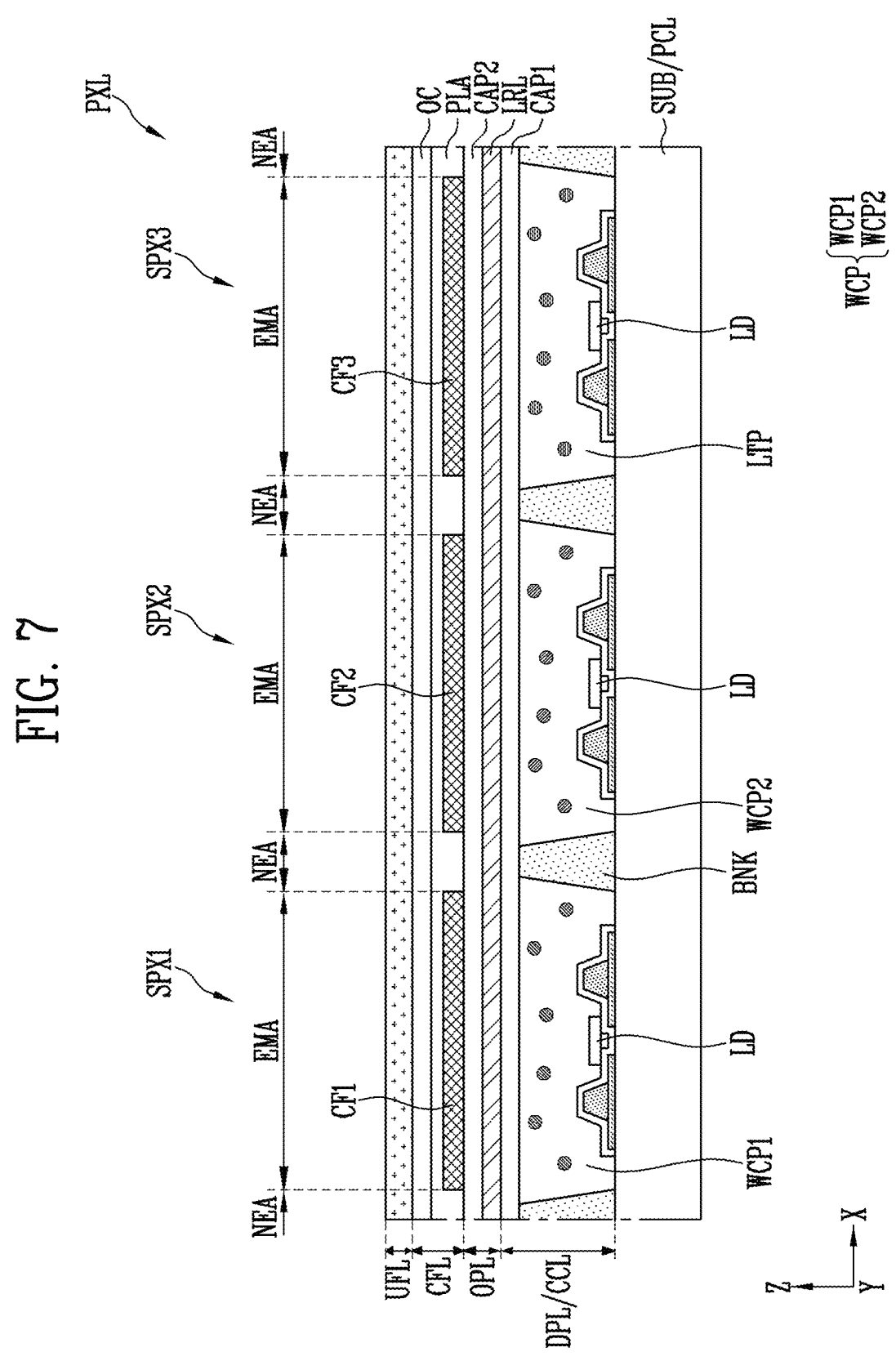
FIGS. 7 and 8 are schematic cross-sectional views illustrating a pixel in accordance with an embodiment of the disclosure.
Figure 8:
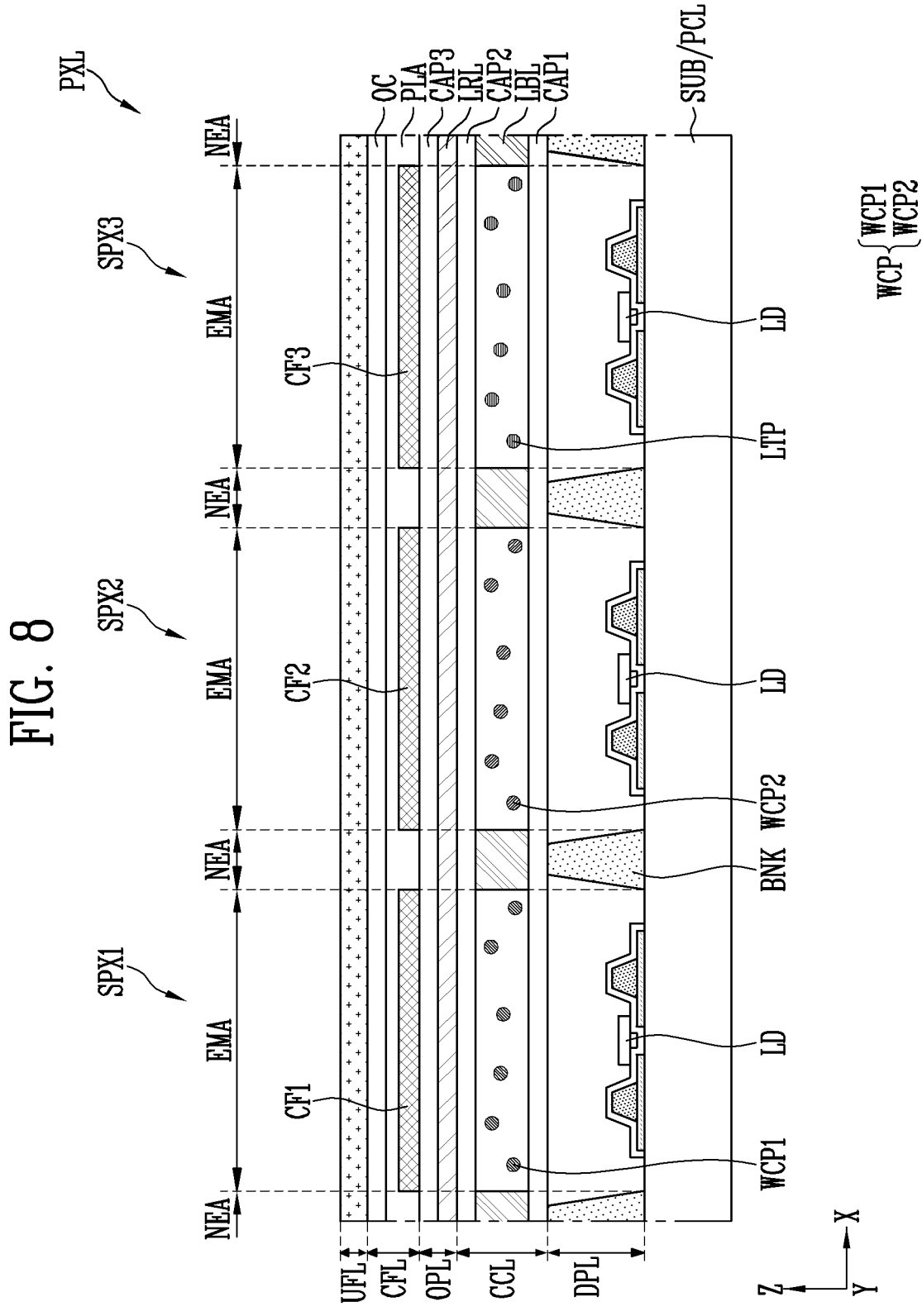

FIGS. 7 and 8 are schematic cross-sectional views illustrating a pixel in accordance with an embodiment of the disclosure. For convenience of description, individual components of the pixel circuit layer PCL and the display element layer DPL are briefly expressed in FIGS. 7 and 8.

Referring to FIG. 7, light emitting elements LD disposed in sub-pixels SPX1, SPX2, and SPX3 may emit light of a same color. For example, the sub-pixels SPX1, SPX2, and SPX3 may include light emitting elements LD emitting light of a third color (e.g., blue light). A color conversion layer CCL and/or a color filter layer CFL may be provided in the sub-pixels SPX1, SPX2, and SPX3 and display a full-color image. However, the disclosure is not limited thereto, and the sub-pixels SPX1, SPX2, and SPX3 may include light emitting elements LD emitting lights of different colors.

The color conversion layer CCL and the display element layer DPL may be disposed on a same layer. For example, the color conversion layer CCL may be disposed between banks BNK.

The bank BNK may be located in non-emission areas NEA of the sub-pixels SPX1, SPX2, and SPX3. The bank BNK may be formed between the sub-pixels SPX1, SPX2, and SPX3 or at a boundary between the sub-pixels SPX1, SPX2, and SPX3 and surround an emission area EMA of each of the sub-pixels SPX1, SPX2, and SPX3. Therefore, the bank BNK may define the emission area EMA of each of the sub-pixels SPX1, SPX2, and SPX3. The bank BNK may serve as a dam structure which prevents a solution for forming a wavelength conversion pattern WCP and a light transmission pattern LTP in an emission area EMA (e.g., a corresponding emission area EMA) from being introduced into emission areas EMA (e.g., adjacent emission areas EMA) of adjacent sub-pixels SPX1, SPX2, and SPX3 or controls an amount (e.g., a certain or selectable amount) of solution to be supplied to each emission area EMA. For example, the bank BNK may separate the corresponding emission area EMA of a corresponding sub-pixel (e.g., one of the first to third sub-pixels SPX1, SPX2, and SPX3) from the adjacent emission areas EMA of the adjacent sub-pixels SPX1, SPX2, and SPX3, and the solution for forming the wavelength conversion pattern WCP and the light transmission pattern LTP may be supplied to the corresponding sub-pixel SPX without mixing with an adjacent solution.

The bank BNK may include an organic material or an inorganic material. In some embodiments, the bank BNK may include a black matrix material (or light blocking material) and prevent color mixture.

The color conversion layer CCL may include a wavelength conversion pattern WCP (or color conversion particle), a light transmission pattern LTP, and/or a first capping layer CAP1. The wavelength conversion pattern WCP may include a first wavelength conversion pattern WCP1 and a second wavelength conversion pattern WCP2.

The first wavelength conversion pattern WCP1 may overlap an emission area EMA of the first sub-pixel SPX1 in a plan view. The second wavelength conversion pattern WCP2 may overlap an emission area EMA of the second sub-pixel SPX2 in a plan view. The light transmission pattern LTP may overlap an emission area EMA of the third sub-pixel SPX3 in a plan view.

The first wave conversion pattern WCP1 may include first color conversion particles for converting light of the third color, which is emitted from a light emitting element LD, into light of a first color. In an example, when the light emitting element LD is a blue light emitting element emitting blue light, and the first sub-pixel SPX1 is a red pixel, the first wavelength conversion pattern WCP1 may include a first quantum dot for converting the blue light, which is emitted from the blue light emitting element, into red light.

For example, the first wavelength conversion pattern WCP1 may include multiple first quantum dots dispersed in a matrix material (e.g., a predetermined or selectable matrix material) such as base resin. The first quantum dots may shift a wavelength of the blue light according to energy transition. The first quantum dots may absorb the blue light and emit the red light. When the first sub-pixel SPX1 is a pixel of another color, the first wavelength conversion pattern WCP1 may include a first quantum dot corresponding to the color (e.g., the another color) of the first sub-pixel SPX1.

The second wavelength conversion pattern WCP2 may include second color conversion particles for converting light of the third color, which is emitted from the light emitting element LD, into light of a second color. In an example, when the light emitting element LD is a blue light emitting element emitting blue light, and the second sub-pixel SPX2 is a green pixel, the second wavelength conversion pattern WCP2 may include a second quantum dot for converting the blue light, which is emitted from the blue light emitting element, into green light.

For example, the second wavelength conversion pattern WCP2 may include multiple second quantum dots dispersed in a matrix material (e.g., a predetermined or selectable matrix material) such as base resin. The second quantum dots may shift a wavelength of the blue light according to energy transition. The second quantum dots may absorb the blue light and emit the green light.

Blue light having a relatively short wavelength in a visible light band may be incident into the first quantum dot and the second quantum dot, and absorption coefficients of the first quantum dot and the second quantum dot may be increased. Accordingly, the efficiency of light finally emitted from the first sub-pixel SPX1 and the second sub-pixel SPX2 may be improved, and excellent color reproduction may be ensured. The pixel PXL may be configured by using light emitting elements LD of a same color (e.g., blue light emitting elements), and the manufacturing efficiency of the display device may be improved.

The light transmission pattern LTP may be provided to efficiently use light of the third color emitted from the light emitting element LD. In an example, when the light emitting element LD is a blue light emitting element emitting blue light, and the third sub-pixel SPX3 is a blue pixel, the light transmission pattern LTP may include at least one kind of light scattering particles to efficiently use light emitted from the light emitting element LD.

For example, the light transmission pattern LTP may include light scattering particles dispersed in a matrix material (e.g., a predetermined or selectable matrix material) such as base resin. In an example, the light transmission pattern LTP may include light scattering particles such as silica, but the material constituting the light scattering particles is not limited thereto.

The light scattering particles may not be disposed in only the emission area EMA of the third sub-pixel SPX3. In an example, the light scattering particles may be included even at the inside of the first wavelength conversion pattern WCP1 and/or the second wavelength conversion pattern WCP2.

The first capping layer CAP1 may seal (or cover) the wave conversion pattern WCP and the light transmission pattern LTP. The first capping layer CAP1 may be disposed between a low refractive layer LRL and the display element layer DPL. The first capping layer CAP1 may be provided throughout the sub-pixels SPX1, SPX2, and SPX3. The first capping layer CAP1 may prevent the color conversion layer CCL from being damaged or contaminated due to infiltration of an impurity such as moisture or air from the outside.

The first capping layer CAP1 may be configured as a single layer or a multi-layer including at least one insulating material of silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto.

An optical layer OPL may include the low refractive layer LRL and a second capping layer CAP2. The optical layer OPL may be disposed on the color conversion layer CCL. The optical layer OPL may be disposed on the display element layer DPL.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the sub-pixels SPX1, SPX2, and SPX3.

The low refractive layer LRL may function to allow light provided from the color conversion layer CCL to be recycled by total reflection. For example, the light provided from the color conversion layer CCL may be reflected (e.g., totally reflected) from the low refractive layer LRL, and the reflected light may be recycled. Thus, light efficiency may be improved. To this end, the low refractive layer LRL may have a refractive index relatively lower than a refractive index of the color conversion layer CCL.

The low refractive layer LRL may include a base resin and hollow particles dispersed in the base resin. Each of the hollow particles may include a hollow silica particle. As another example, the hollow particle may be a pore formed by porogen, but the disclosure is not limited thereto. Also, the low refractive layer LRL may include any one particle including at least one of zinc oxide ($ZnO_x$), titanium dioxide ($TiO_x$), and nano silicate, but the disclosure is not limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the sub-pixels SPX1, SPX2, and SPX3. The second capping layer CAP2 may prevent the low refractive layer LRL from being damaged or contaminated due to infiltration of an impurity such as moisture or air from the outside. The first capping layer CAP1 and the second capping layer CAP2 may include a same material. In other embodiments, the second capping layer CAP1 may include one or more materials selected from the materials that may be used to form the first capping layer CAP1 as discussed herein.

The color filter layer CFL may be disposed on the second capping layer CAP2.

The color filter layer CFL may include color filters CF1, CF2, and CF3, a planarization layer PLA, and/or an overcoat layer OC.

The color filters CF1, CF2, and CF3 may be disposed on the second capping layer CAP2. The color filters CF1, CF2, and CF3 may respectively overlap the emission areas EMA of the sub-pixels SPX1, SPX2, and SPX3 in a plan view.

A first color filter may allow light of the first color to be selectively transmitted therethrough (e.g., may selectively pass the light of the first color), a second color filter may allow light of the second color to be selectively transmitted therethrough (e.g., may selectively pass the light of the second color), and a third color filter may allow light of the third color to be selectively transmitted therethrough (e.g., may selectively pass the light of the third color).

The planarization layer PLA may be provided over the color filters CF1, CF2, and CF3. The planarization layer PLA may cover the color filters CF1, CF2, and CF3. The planarization layer PLA may planarize a step difference occurring due to the color filters CF1, CF2, and CF3. The planarization layer PLA may be provided throughout the sub-pixels SPX1, SPX2, and SPX3.

The planarization layer PLA may include an organic material. However, the disclosure is not limited thereto, and the planarization layer PLA may include an inorganic material.

The overcoat layer OC may be disposed on the planarization layer PLA. The overcoat layer OC may be disposed between an upper film layer UFL and the color filter layer CFL. The overcoat layer OC may be provided throughout the sub-pixels SPX1, SPX2, and SPX3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material or an inorganic material. For example, the overcoat layer OC may include one or more materials selected from the materials that may be used to form the planarization layer PLA as discussed herein.

The upper film layer UFL may be disposed on the color filter layer CFL. The upper film layer UFL may be disposed at an outer portion (e.g., the uppermost portion) of the display device to reduce external influence on the display device. The upper film layer UFL may be provided throughout the sub-pixels SPX1, SPX2, and SPX3.

The upper film layer UFL may include an anti-reflective (AR) coating. The AR coating may mean a component formed by coating a material (e.g., anti-reflection material) having an anti-reflection function on a surface of a component (e.g., a specific or selectable component). For example, the anti-reflection material may be coated on a film or layer to form the upper film layer UFL. The coated material of the upper film layer UFL may have a low reflexibility. In an example, the material used for the AR coating may include at least one of silicon oxide ($SiO_x$), aluminum oxide ($AlO_x$), and titanium oxide ($TiO_x$), but the disclosure is not limited thereto.

Referring to FIG. 8, the color conversion layer CCL may be disposed on the display element layer DPL. For example, the first capping layer CAP1 may seal (or cover) the display element layer DPL, and the color conversion layer CCL may be disposed on the first capping layer CAP1.

The color conversion layer CCL may further include a light blocking layer LBL (or light blocking pattern). The light blocking layer LBL may be disposed between the first capping layer CAP1 and the second capping layer CAP2. The light blocking layer LBL may be disposed between the sub-pixels SPX1, SPX2, and SPX3 or at a boundary between the sub-pixels SPX1, SPX2, and SPX3 (e.g., between adjacent ones of the sub-pixels SPX1, SPX2, and SPX3). For example, the light blocking layer LBL may be provided in each non-emission area NEA, and include an opening exposing each emission area EMA. The first wavelength conversion pattern WCP1, the second wavelength conversion pattern WCP2, and the light transmission pattern LTP may be respectively provided in the openings of the light blocking layer LBL.

The light blocking layer LBL may be formed of an organic material including at least one of graphite, carbon black, black pigment, and black dye. In other embodiments, the light blocking layer LBL may be formed of a metal material including chromium (Cr). However, the disclosure is not limited thereto, and various materials capable of blocking light transmission and absorbing light may be used for the light blocking layer LBL.

The second capping layer CAP2 may seal (or cover) the first wavelength conversion pattern WCP1, the second wavelength conversion pattern WCP2, and the light transmission pattern LTP.

The low refractive layer LRL may be disposed between the second capping layer CAP2 and a third capping layer CAP3. The first capping layer CAP1 and the third capping layer CAP3 may include a same material. The third capping layer CAP3 may include one or more materials selected from the materials that may be used to form the first capping layer CPA1 as discussed herein.

Figure 9:
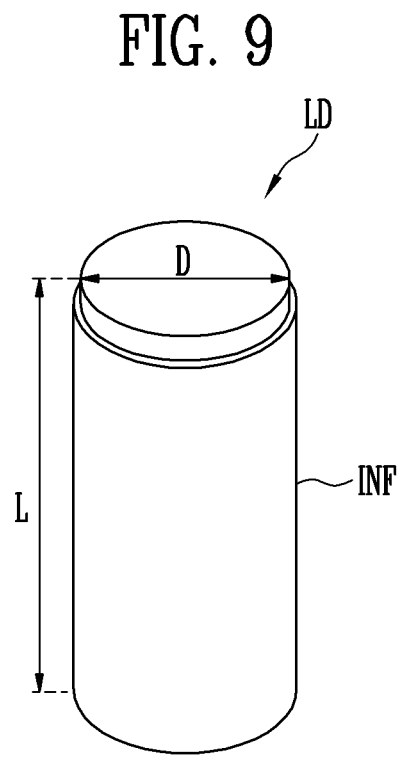
Figure 10:
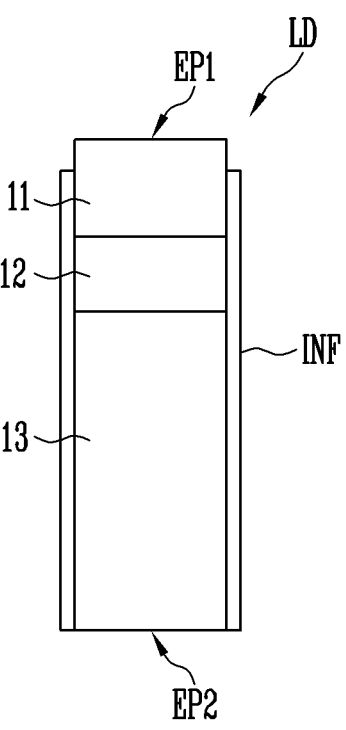
FIG. 10 is a schematic perspective view illustrating the light emitting element shown in FIG. 9.

FIG. 9 is a schematic perspective view illustrating a light emitting element in accordance with an embodiment of the disclosure. FIG. 10 is a schematic perspective view illustrating the light emitting element shown in FIG. 9. Although a pillar-shaped light emitting element LD is illustrated in FIGS. 9 and 10, the kind and/or shape of the light emitting element LD is not limited thereto.

Referring to FIGS. 9 and 10, the light emitting element LD may include a first semiconductor layer 11, an active layer 12, and/or a second semiconductor layer 13.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. Another of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In some embodiments, the light emitting element LD may be a light emitting element manufactured in a pillar shape through an etching process, etc. In the specification, the term "pillar shape" may include a rod-like shape or bar-like shape, of which an aspect ratio is greater than about 1, such as a cylinder or a polyprism, and the shape of the cross-section thereof is not limited thereto.

The light emitting element LD may have a size small to a degree of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices (e.g., a display device, and the like), which use, as a light source, a light emitting device using the light emitting element LD.

The first semiconductor layer 11 may be a first conductivity type semiconductor layer. For example, the first semiconductor layer 11 may include a p-type semiconductor layer. In an example, the first semiconductor layer 11 may include at least one semiconductor material of InAlGaN, GaN, AlGaN, InGaN, AlN, and InN, and include a p-type semiconductor layer doped with a first conductivity type dopant such as Mg. However, the material constituting the first semiconductor layer 11 is not limited thereto. The first semiconductor layer 11 may be configured with various materials.

The active layer 12 may be disposed between the first semiconductor layer 11 and the second semiconductor layer 13. The active layer 12 may include at least one structure of a single well structure, a multi-well structure, a single quantum well structure, a multi-quantum well (MQW) structure, a quantum dot structure, and a quantum wire structure, but the disclosure is not limited thereto. The active layer 12 may include at least one of GaN, InGaN, InAlGaN, AlGaN, and AlN. However, the disclosure is not limited thereto, and the active layer 12 may include other suitable semiconductor materials. For example, the active layer 12 may include a combination of the above-described materials. The active layer 12 may be configured with various materials.

In case that a voltage which is a threshold voltage or more is applied to ends (e.g., both ends or first and second end portions EP1 and EP2) of the light emitting element LD, electron-hole pairs may be combined in the active layer 12 and the light emitting element LD may emit light. The light emission of the light emitting element LD may be controlled by using such a principle, and the light emitting element LD may be used as a light source for various light emitting devices, including a pixel of a display device.

The second semiconductor layer 13 may be formed on the active layer 12, and may include a semiconductor layer having a type different from a type of the first semiconductor layer 11. For example, the second semiconductor layer 13 may include an n-type semiconductor layer. In an example, the second semiconductor layer 13 may include at least one semiconductor material of InAlGaN, GaN, AlGaN, InGaN, AlN, and InN, and include an n-type semiconductor layer doped with a second conductivity type dopant such as Si, Ge, or Sn. However, the material constituting the second semiconductor layer 13 is not limited thereto. The second semiconductor layer 13 may be configured with various materials.

In some embodiments, an electrode layer may be further disposed on the first end portion EP1 and/or the second end portion EP2 of the light emitting element LD. The electrode layer may include a transparent metal or a transparent metal oxide. In an example, the electrode layer may include at least one of indium tin oxide (ITO), indium zinc oxide (IZO), and zinc tin oxide (ZTO), but the disclosure is not limited thereto. In case that the electrode layer is made of a transparent metal or a transparent metal oxide, light generated in the active layer 12 of the light emitting element LD may pass through the electrode layer 14 and be emitted to the outside of the light emitting element LD.

An insulative film INF may be provided on a surface (e.g., an outer surface or a side surface) of the light emitting element LD. The insulative film INF may be disposed (e.g., directly disposed) on surfaces (e.g., outer surfaces or side surfaces) of the first semiconductor layer 11, the active layer 12, and/or the second semiconductor layer 13. The insulative film INF may expose the first and second end portions EP1 and EP2 of the light emitting element LD, which have different polarities. In some embodiments, the insulative film INF may expose a side portion of the first semiconductor layer 11 and/or the second semiconductor layer 13, adjacent to the first and second end portions EP1 and EP2 of the light emitting element LD.

The insulative film INF may prevent an electrical short circuit which may occur when the active layer 12 is in contact with a conductive material except the first and second semiconductor layers 11 and 13. Also, the insulative film INF may minimize a surface defect of light emitting elements LD. Thus, the lifetime and light emission efficiency of the light emitting elements LD may be improved.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be configured as a double layer, and layers constituting the double layer may include different materials. In an example, the insulative film INF may be configured as a double layer including aluminum oxide ($AlO_x$) and silicon oxide ($SiO_x$), but the disclosure is not limited thereto. In some embodiments, the insulative film INF may be omitted.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

A method of manufacturing the above-described display device in accordance with an embodiment of the disclosure is described.

FIGS. 11 to 17 are process cross-sectional views schematically illustrating a method of manufacturing the display device in accordance with an embodiment of the disclosure. FIGS. 11 to 17 illustrate a method of manufacturing the display device, based on FIG. 5. In FIGS. 11 to 17, components substantially identical to the components shown in FIG. 5 are designated by like reference numerals, and detailed description of the same constituent elements is omitted.

Figure 11:
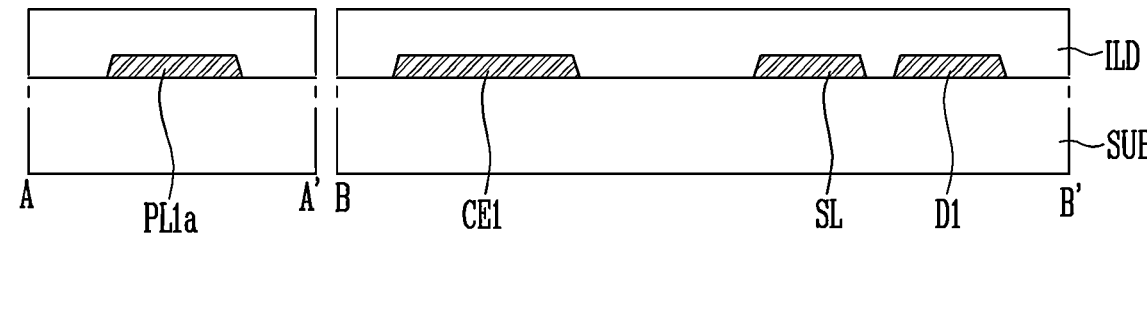
FIGS. 11 to 17 are process cross-sectional views schematically illustrating a method of manufacturing the display device in accordance with an embodiment of the disclosure.

Referring to FIG. 11, a first conductive layer and an interlayer insulating layer ILD may be formed on a substrate SUB. The first conductive layer may include a first power conductive layer PL1*a*, a first capacitor electrode CE1, a sensing line SL, and/or data lines D1, D2, and D3. The interlayer insulating layer ILD may be formed (e.g., directly formed) over the first conductive layer.

Figure 12:
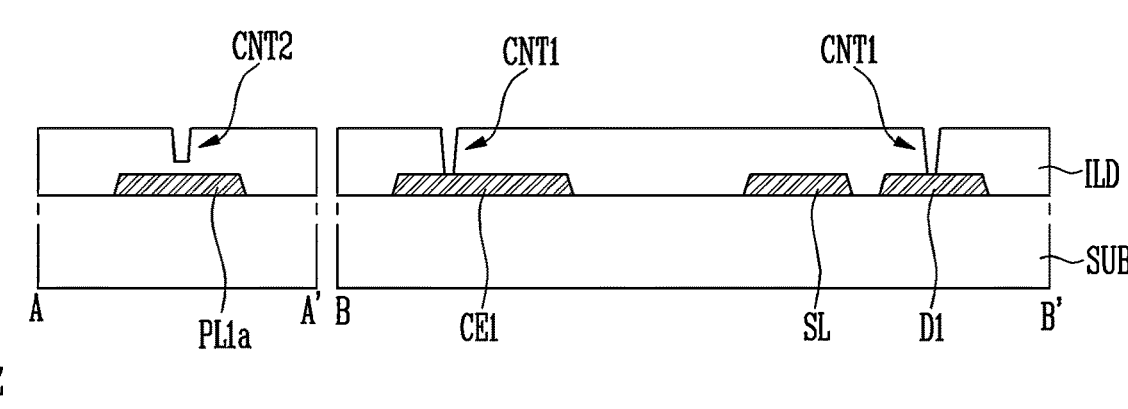
Figure 12:
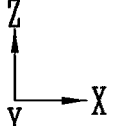

Referring to FIG. 12, the interlayer insulating layer ILD may be primarily etched. A first contact part CNT1 and a second contact part CNT2 may be formed in the process of the primarily etching of the interlayer insulating layer ILD. A depth of the first contact part CNT1 and a depth of the second contact part CNT2 may be different from each other. In an example, the interlayer insulating layer ILD may be completely etched at the first contact part CNT1, and the first conductive layer may be exposed. The interlayer insulating layer ILD may be partially etched at the second contact part CNT2, and the first conductive layer may be covered by the interlayer insulating layer ILD. In an example, the first contact part CNT1 and the second contact part CNT2 may be simultaneously formed by using a halftone mask, but the disclosure is not limited thereto.

Figure 13:
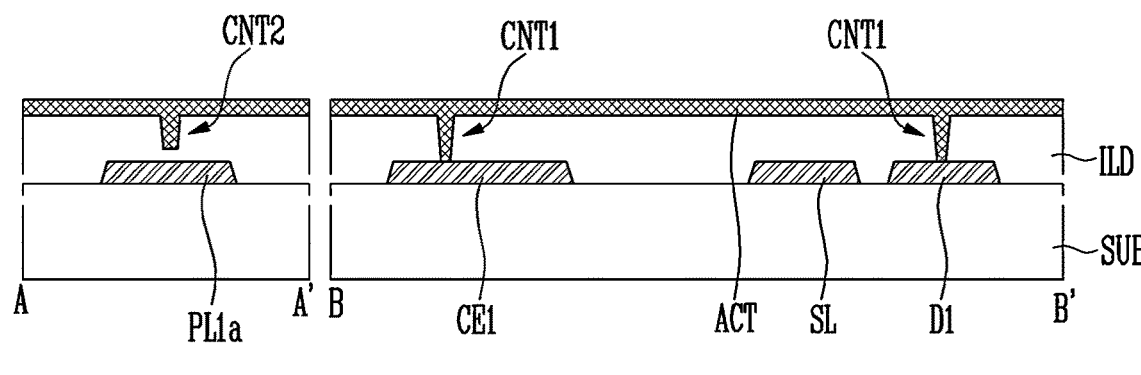
Figure 13:
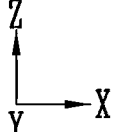

Referring to FIG. 13, a semiconductor layer ACT may be formed on the interlayer insulating layer ILD. The semiconductor layer ACT may be formed (e.g., entirely formed) on the substrate SUB. The semiconductor layer ACT may include poly-silicon, amorphous silicon, an oxide semiconductor, and the like.

The semiconductor layer ACT may be in contact with the first conductive layer (e.g., the first capacitor electrode CE1 and/or a first data line DO, exposed by the first contact part CNT1.

Figure 14:
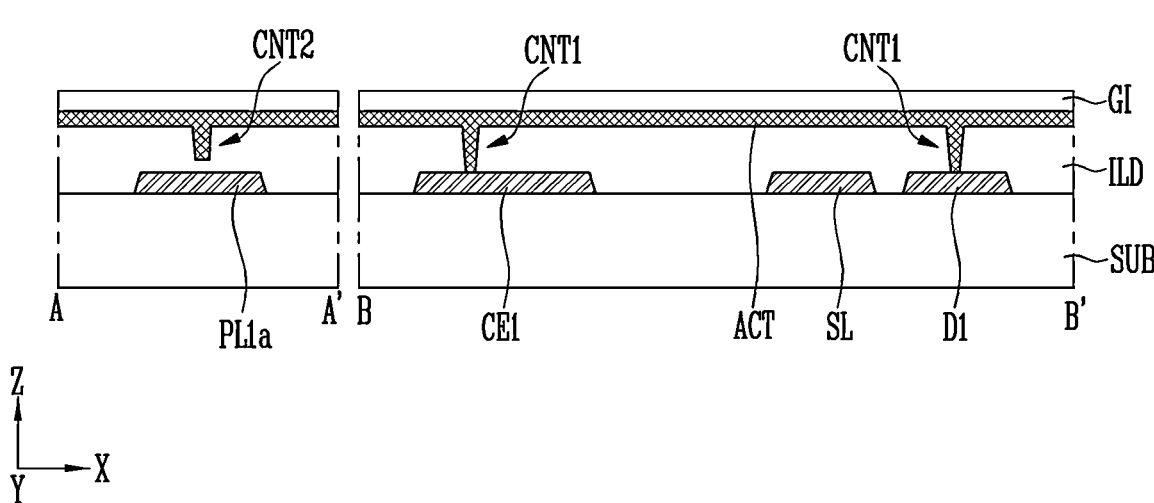

Referring to FIG. 14, a gate insulating layer GI may be formed on the semiconductor layer ACT. The gate insulating layer GI may be formed (e.g., entirely formed) on the substrate SUB.

Figure 15:
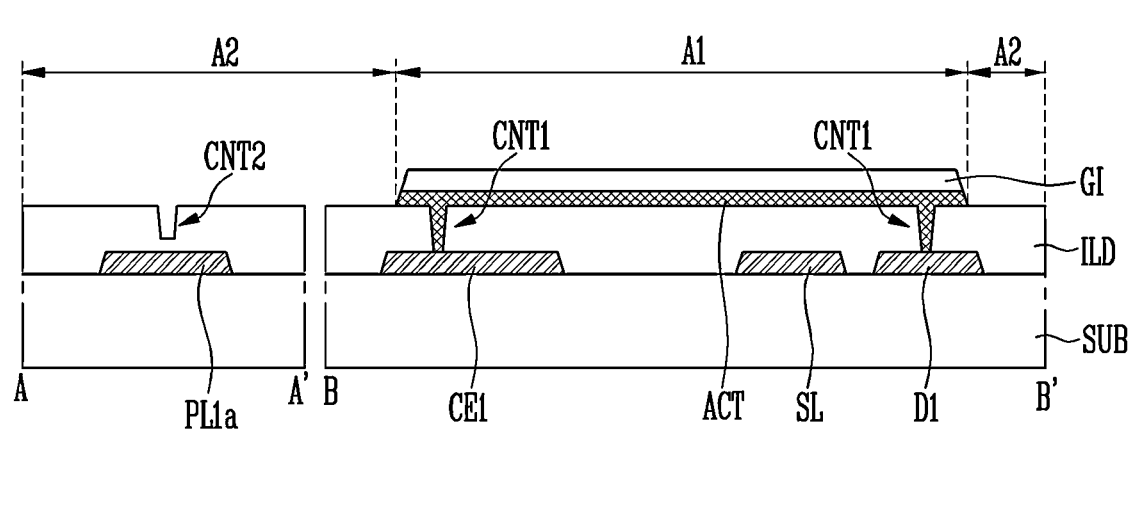

Referring to FIG. 15, the semiconductor layer ACT and the gate insulating layer GI may be etched. The semiconductor layer ACT and the gate insulating layer GI in a second area A2 may be etched, and the semiconductor layer ACT and the gate insulating layer GI in a first area A1 may be partially formed. The semiconductor layer ACT and the gate insulating layer GI may be simultaneously etched, but the disclosure is not limited thereto.

Figure 16:
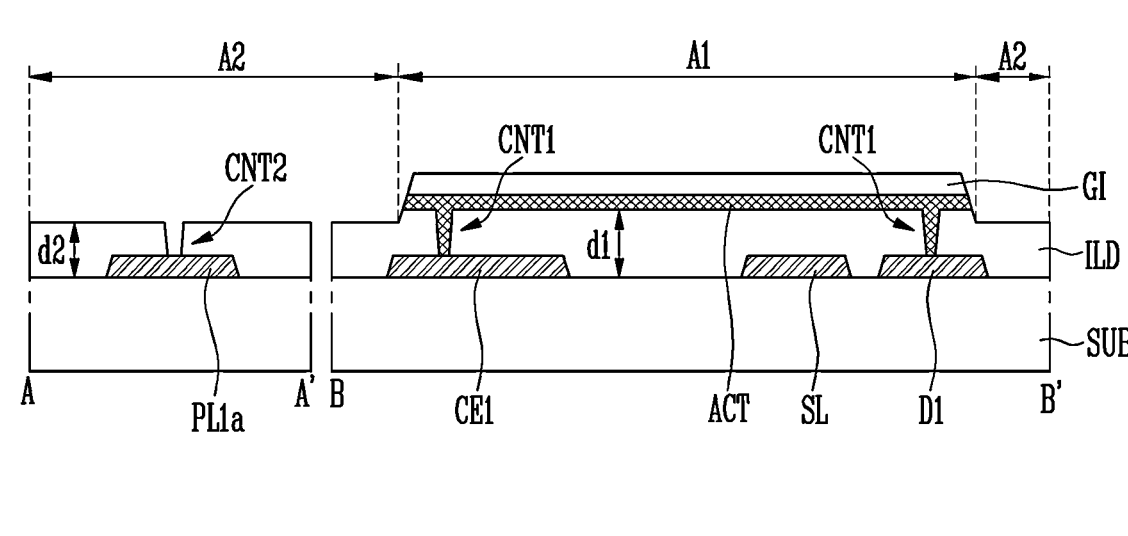

Referring to FIG. 16, the interlayer insulating layer ILD may be secondarily etched. In an example, the second area A2 of the interlayer insulating layer ILD, which is exposed by the semiconductor layer ACT and the gate insulating layer GI, may be etched. Accordingly, a thickness d1 of the first area A1 of the interlayer insulating layer ILD may be thicker than a thickness d2 of the second area A2 of the interlayer insulating layer ILD. The interlayer insulating layer ILD may be completely etched at the second contact part CNT2 formed in the second area A2 in the process of secondarily etching the interlayer insulating layer ILD. Thus, the first conductive layer may be exposed.

Figure 17:
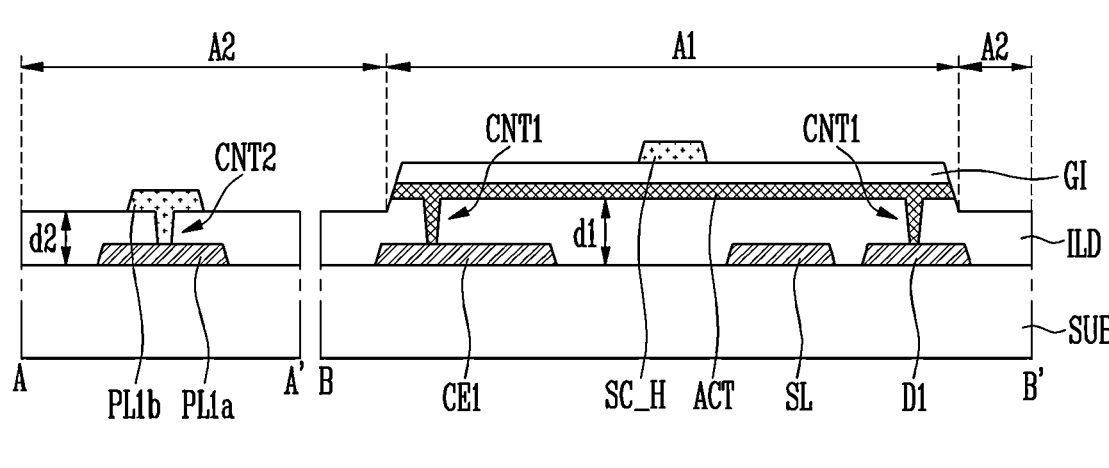
Figure 17:
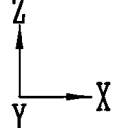

Referring to FIG. 17, a second conductive layer may be formed on the interlayer insulating layer ILD and the gate insulating layer GI. The second conductive layer may include a second power conductive layer PL1*b* and a horizontal scan line SC_H. In an embodiment, the horizontal scan line SC_H may be formed on the gate insulating layer GI in the first area A1. The second power conductive layer PL1*b* may be formed on the second area A2 of the interlayer insulating layer ILD exposed by the semiconductor layer ACT and the gate insulating layer GI. The second power conductive layer PL1*b* may be in contact with the first conductive layer exposed by the second contact part CNT2. In an example, the second power conductive layer PL1*b* may be in contact with the first power conductive layer PL1*a* through the second contact part CNT2.

A protective layer PSV (e.g., refer to FIG. 5) may be formed over the second conductive layer, and a pixel circuit layer PLC (e.g., refer to FIG. 5) may be formed. Electrodes ELT (e.g., refer to FIG. 6) spaced apart from each other may be formed on the pixel circuit layer PCL, and light emitting elements LD (e.g., refer to FIG. 6) may be aligned between the electrodes ELT. A first connection electrode CNE1 (e.g., refer to FIG. 6) may be formed on first end portions of the light emitting elements LD, and a second connection electrode CNE2 (e.g., refer to FIG. 6) may be formed on second end portions of the light emitting elements LD. Thus, the display device shown in FIGS. 5 and 6 may be manufactured. In some embodiments, the first connection electrode CNE1 and the second connection electrode CNE2 may be simultaneously formed through a same process. As described above, when the connection electrodes CNE are simultaneously formed, the number of masks may be decreased, and the process of manufacturing the display device may be simplified.

In accordance with the above-described embodiment, the first contact part CNT at which the semiconductor layer ACT and the first conductive layer are in contact with each other may be formed in the first area A1. A second contact part CNT2 at which the second conductive layer and the first conductive layer are in contact with each other may be formed in the second area A2. Accordingly, a side surface contact structure of the second conductive layer and the semiconductor layer ACT may be removed. Thus, transistor characteristic deterioration occurring due to the side surface contact may be prevented.

In accordance with the disclosure, contact parts at which a semiconductor layer and a second conductive layer are in contact with a first conductive layer may be formed in different areas. Thus, a side surface contact structure of the second conductive layer and the semiconductor layer may be removed, and the semiconductor layer and the second conductive layer may not be in contact with other elements through a side surface thereof. Thus, transistor characteristic deterioration occurring due to the side surface contact may be prevented, and electrical characteristics of the transistor may be improved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
   a substrate;
   a first conductive layer;

a first insulating layer on the first conductive layer and on the substrate;

a semiconductor layer on the first insulating layer and electrically connected to the first conductive layer;

a second conductive layer on the semiconductor layer and electrically connected to the first conductive layer; and light-emitting elements on the second conductive layer, wherein a first distance between a first part of a top surface of the first insulating layer and the substrate in a first area, the first part of the top surface of the first insulating layer overlapping the semiconductor layer in a plan view, is different from a second distance between a second part of the top surface of the first insulating layer and the substrate in a second area, the second part of the top surface of the first insulating layer being exposed by the semiconductor layer, the first distance and the second distance being along a thickness direction of the substrate; and wherein the second conductive layer is directly on the first insulating layer in the second area such that the second conductive layer directly contacts the second part of the top surface of the first insulating layer exposed by the semiconductor layer.

2. The display device of claim 1, wherein the semiconductor layer is in electrical contact with the first conductive layer through a first contact hole defined in the first insulating layer in the first area.

3. The display device of claim 1, wherein the second conductive layer is in electrical contact with the first conductive layer through a second contact hole defined in the first insulating layer in the second area.

4. The display device of claim 1, wherein the first distance is greater than the second distance.

5. The display device of claim 1, further comprising a second insulating layer on the semiconductor layer.

6. The display device of claim 5, wherein the second insulating layer is in the first area and exposes the second area.

7. The display device of claim 5, wherein the second conductive layer is directly on the second insulating layer in the first area.

8. The display device of claim 1, further comprising:

a first connection electrode on first end portions of the light-emitting elements; and a second connection electrode on second end portions of the light-emitting elements.

9. The display device of claim 8, wherein the first connection electrode and the second connection electrode are at a same layer.

10. A method of manufacturing a display device, the method comprising:

forming a first insulating layer on a first conductive layer;

forming a semiconductor layer on a first area of the first insulating layer;

forming a second insulating layer on the semiconductor layer;

etching a second area of the first insulating layer, which is exposed by the semiconductor layer;

forming a second conductive layer directly on the second area of the first insulating layer and directly on the second insulating layer; and providing light-emitting elements on the second conductive layer.

11. The method of claim 10, further comprising forming a first contact hole in the first area of the first insulating layer.

12. The method of claim 11, wherein the forming of the first contact hole further comprises partially etching the second area of the first insulating layer.

13. The method of claim 11, wherein the semiconductor layer is in electrical contact with the first conductive layer through the first contact hole.

14. The method of claim 10, further comprising forming a second contact hole in the second area of the first insulating layer.

15. The method of claim 14, wherein the second conductive layer is in electrical contact with the first conductive layer through the second contact hole.

16. The method of claim 10, further comprising etching the semiconductor layer and the second insulating layer.

17. The method of claim 10, further comprising:

forming a first connection electrode on first end portions of the light-emitting elements; and forming a second connection electrode on second end portions of the light-emitting elements.

18. The method of claim 17, wherein the first connection electrode and the second connection electrode are simultaneously formed through a same process.

* * * * *